United States Patent
Kitada

(10) Patent No.: US 6,484,303 B2
(45) Date of Patent: Nov. 19, 2002

(54) APPARATUS FOR LAYOUT DESIGNING OF SEMICONDUCTOR DEVICE, METHOD OF LAYOUT DESIGNING, AND SEMICONDUCTOR DEVICE

(75) Inventor: Osamu Kitada, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/900,026

(22) Filed: Jul. 9, 2001

(65) Prior Publication Data

US 2002/0087942 A1 Jul. 4, 2002

(30) Foreign Application Priority Data

Dec. 28, 2000 (JP) ........................................ 2000-401524

(51) Int. Cl.7 ............................................. G06F 17/50
(52) U.S. Cl. ............................................. 716/11; 716/2
(58) Field of Search ........................................ 716/11, 2

(56) References Cited

U.S. PATENT DOCUMENTS 5,463,638 A * 10/1995 De Lang .................... 371/22.3

FOREIGN PATENT DOCUMENTS

JP 09-293721 11/1997
JP 10-027796 1/1998

* cited by examiner

Primary Examiner—M. Tran
(74) Attorney, Agent, or Firm—McDermott, Will & Emery

(57) ABSTRACT

A layout designing apparatus and a layout designing method that can improve the uniformity of the pattern density of a layout pattern in which dummy patterns are formed, and a semiconductor device manufactured using the layout designing method can be obtained. The layout designing method includes the steps of entering a plurality of circuit patterns of a semiconductor device; recognizing the positional data of the entered plurality of circuit patterns; producing a dummy pattern group including a plurality of dummy patterns, each of which being arranged per repetitive distance determined based on the recognized positional data of the circuit patterns; extracting a final dummy pattern including a dummy pattern located in a region not overlapping with the circuit patterns from the dummy pattern group; and outputting a layout pattern including the extracted final dummy pattern and the circuit patterns.

15 Claims, 15 Drawing Sheets

US 6,484,303 B2

APPARATUS FOR LAYOUT DESIGNING OF SEMICONDUCTOR DEVICE, METHOD OF LAYOUT DESIGNING, AND SEMICONDUCTOR DEVICE

BACKGROUND OF THE INVENTION

1. Field of the Invention

The present invention relates to a layout designing apparatus, a layout designing method and a semiconductor device, and more particularly, to a layout designing apparatus outputting a layout pattern including a dummy pattern, a layout designing method, and a semiconductor device manufactured using the same.

2. Description of the Background Art

Conventionally, a photolithographic processing technology has been used for forming predetermined interconnections, electrodes and so forth in the process of manufacturing a semiconductor device. In the photolithographic processing technology, a resist film is formed on the surface of a semiconductor substrate, and thereafter transfers a pattern to be transferred (hereinafter referred to as "transfer pattern") formed on a photomask onto this resist film by exposure and development processes.

Here, the resist film onto which the transfer pattern is transferred is formed on an interlayer insulating film or the like formed on the surface of the semiconductor substrate. A substructure such as interconnections or electrodes are generally formed under the interlayer insulating film. Because of such a substructure, an irregular portion may be formed on the upper surface of the interlayer insulating film. Existence of such an irregular portion forms a resist-film irregular portion corresponding to the irregular portion on the upper surface of the resist film formed on the interlayer insulating film. In a region where such a resist-film irregular portion is formed, the distance between the photomask and the upper surface of the resist film will be locally varied in the exposure step of transferring the transfer pattern of the photomask onto the resist film. This has caused problems such that the dimension of the transfer pattern transferred onto the resist film is varied, or that the transfer pattern is not resolved.

To prevent such problems from occurring, a step of planarizing the upper surface of the interlayer insulating film by the CMP (Chemical Mechanical Polishing) method is carried out before forming of the resist film. However, when the density of interconnections or the like in the substructure is not uniform and steps in the irregular portion on the upper surface of the interlayer insulating film are large, it was sometimes difficult to sufficiently planarize the upper surface of the interlayer insulating film by the CMP method.

Therefore, conventionally, a method has been employed in which dummy interconnections are formed in a region where no interconnection exists as the substructure to make the density of structures such as the interconnections uniform in the substructure in order to reduce the steps in the irregular portion (to increase the flatness) on the upper surface of the interlayer insulating film. To form such dummy interconnections, a layout designing method as described below is executed in a layout designing step in the manufacturing process of a semiconductor device.

FIG. 30 is a flow chart for illustrating a conventional layout designing method. Further, FIG. 31 is a schematic view showing a layout pattern obtained by the layout designing method shown in FIG. 30. Referring to FIGS. 30 and 31, the conventional layout designing method will be described.

Referring to FIGS. 30 and 31, in a dummy pattern arrangement method of the conventional layout designing method, first, the step of entering circuit patterns 101a to 101c such as interconnections constituting a circuit of the semiconductor device (S110) is executed. In this step of entering the circuit patterns (S110), data of the coordinates of circuit patterns 101a to 101c are entered and held in a memory of a computer system in which a software executing the layout designing method is installed.

Next, the step of producing dummy patterns 103a and 103b (S130) on the entire surface of a chip region in which circuit patterns 101a to 101c are arranged is executed. In the step of producing dummy patterns (S130), dummy patterns 103a and 103b are arranged in a matrix with a predetermined pitch. Further, the size of dummy patterns 103a and 103b are also predetermined. These dummy patterns 103a and 103b are the patterns for forming dummy interconnections.

Subsequently, the step of extracting dummy patterns 103a (S140), which are located in regions that are not overlapping with circuit patterns 101a to 101c and are spaced by predetermined distances from circuit patterns 101a to 101c, is executed.

Thereafter, the step of outputting a layout pattern (S150), including dummy patterns 103a extracted in the step of extracting the dummy patterns (S140) and circuit patterns 101a to 101c, is executed. Thus, the layout pattern can be obtained in which dummy patterns 103a indicated by the solid line are arranged in the regions where none of circuit patterns 101a to 101c is formed, as shown in FIG. 31.

Then, the transfer pattern of a photomask is formed based on such a layout pattern. Moreover, interconnections and dummy interconnections are formed on the semiconductor substrate based on this transfer pattern by the photolithographic processing.

The above-described conventional layout designing method had a problem as described below. In the conventional layout designing method, values that were predetermined irrespective of circuit patterns 101a to 101c were used for the size and the pitch of dummy patterns 103a and 103b in the step of producing dummy patterns (S130). In such a case, the pitches with which circuit patterns 101a to 101c are formed and the pitch with which dummy patterns 103a and 103b are formed may be different. Thus, circuit patterns 101a to 101c and dummy patterns 103a and 103b would overlap with each other more than necessary as shown in FIG. 31, and hence the number of dummy patterns 103b not extracted in the step of extracting dummy patterns (S140) would be increased. As a result, there were some cases in the layout pattern obtained in the step of outputting the layout pattern (S150), such that dummy patterns were not arranged in portions with enough spaces for the dummy patterns to be arranged (e.g. the region between circuit pattern 101b and circuit pattern 101c), and the uniformity of the pattern density were insufficient.

As such, when the pattern density is not sufficiently made uniform, not enough dummy interconnections will be arranged around the interconnections in the structure of the semiconductor device formed based on this layout pattern. This results in formation of an irregular portion on the upper surface of the interlayer insulating film formed on the structure of such interconnections or the like, which was sometimes impossible to be planarized by the CMP method.

SUMMARY OF THE INVENTION

It is an object of the present invention to provide a layout designing apparatus and a layout designing method capable of improving uniformity of the pattern density of a layout pattern in which a dummy pattern is formed, and to provide a semiconductor device manufactured using the layout designing method.

A layout designing apparatus according to one aspect of the present invention includes an entry unit for entering a plurality of circuit patterns of a semiconductor device; a recognition unit for recognizing positional data of the entered plurality of circuit patterns; a dummy pattern arrangement unit for producing a dummy pattern group including a plurality of dummy patterns, each of the plurality of dummy patterns being arranged per repetitive distance determined based on the recognized positional data of the circuit patterns; an extraction unit for extracting a final dummy pattern including a dummy pattern located in a region other than a region overlapping with the circuit patterns, from the dummy pattern group; and an output unit for outputting a layout pattern including the extracted final dummy pattern and the circuit patterns.

A case is now considered where dummy patterns are arranged between two adjacent circuit patterns spaced such that the dummy patterns can be arranged in between. When the repetitive distance and the arrangement of the dummy patterns are determined independent of the circuit patterns as in the conventional case, even if a plurality of dummy patterns were arranged between the circuit patterns as described earlier, all of the dummy patterns would be partially overlapped with the circuit patterns, which may result that no dummy pattern would be arranged between these circuit patterns in the final dummy pattern. However, according to the present invention, the repetitive distance of the dummy patterns is determined based on the positional data of the circuit patterns, so that the repetitive distance can be selected such that the dummy patterns can be arranged between two circuit patterns so as not to overlap with the two circuit patterns. Thus, the dummy patterns can reliably be arranged between the two circuit patterns in the final dummy pattern. Therefore, the region, in which no dummy pattern is arranged even though there is a space for dummy patterns to be arranged, can be reduced. As a result, a layout pattern having a more uniform pattern density compared to that of the conventional case can be attained using the layout designing apparatus according to the present invention.

In the layout designing apparatus according to the above-described one aspect of the present invention, the recognition unit may include a pitch recognition unit for recognizing a pitch in one direction of the circuit patterns, and the dummy pattern arrangement unit may include a unit for determining a submultiple distance of the recognized pitch as the repetitive distance.

In this case, the dummy patterns can be arranged with a pitch smaller than the pitch of the circuit patterns in one direction of the circuit patterns, so that the dummy patterns can reliably be arranged between the circuit patterns. Thus, the size of the region where no dummy pattern is arranged between the circuit patterns can be reduced in the final dummy pattern. As a result, the pattern density can be more uniform in the layout pattern.

In the layout designing apparatus according to the above-described one aspect of the present invention, the dummy pattern group may include a plurality of additional dummy patterns located between the plurality of dummy patterns, and the final dummy pattern includes the additional dummy patterns located in a region other than a region overlapping with the circuit patterns.

In this case, the additional dummy patterns will be arranged at positions displaced from the dummy patterns by a distance smaller than the repetitive distance.

Here, a case is considered where convex or concave portions are locally formed in the two-dimensional geometry of the circuit patterns. In a region near such convex or concave portions, it may be difficult to sufficiently improve the pattern density by the dummy patterns alone that are arranged with the above-described repetitive distance. Specifically, in the portion where, for example, a convex portion is formed in a circuit pattern, the distance between dummy patterns and the convex portion of the circuit pattern would be shorter, or the convex portion and the dummy patterns are partially overlapped with each other, resulting that no dummy patterns can be arranged in the final dummy pattern. Further, in the portion where, for example, a concave portion is formed in a circuit pattern, the distance between the dummy patterns and the concave portion of the circuit pattern would be larger, decreasing the pattern density compared to the other portions.

Thereat, application of the additional dummy patterns in such a region is considered, that are arranged at positions displaced from the dummy patterns as described above. For example, in the region where a convex portion is formed in a circuit pattern, application of the additional dummy patterns displaced from the dummy patterns in the direction away from the convex portion allows the additional dummy patterns to be arranged in this region so as not to overlap with the convex portion, in such a case that the dummy patterns are partially overlapped with the convex portion. Moreover, in the region where the concave portion is formed in the circuit pattern, the application of the additional dummy patterns displaced from the dummy patterns in the direction approaching the concave portion allows reduction of the distance between the concave portion and the additional dummy patterns. Furthermore, in a case where only one of the dummy patterns arranged per repetitive distance can be arranged in the region described above, application of the additional dummy patterns allows arrangement of more additional dummy patterns in the region. Thus, more uniform pattern density can be attained in the layout pattern.

In the layout designing apparatus according to the above-described one aspect of the present invention, each of the plurality of dummy patterns is preferably arranged per repetitive distance using positions of the circuit patterns as a reference.

In this case, the dummy patterns can reliably be arranged between the circuit patterns by using the positions of the circuit patterns as a reference. This can reduce the number of dummy patterns that are partially overlapping with the circuit patterns. Therefore, the region where dummy patterns are formed can be increased in the final dummy pattern, so that a layout pattern having an improved uniformity of the pattern density can be obtained.

In the layout designing apparatus according to the above-described one aspect of the present invention, the dummy pattern arrangement unit may arrange the dummy patterns in a partial region including the circuit patterns, of a region forming a layout pattern, and the output unit may output a layout pattern including a partial layout pattern for the partial region.

As for the layout designing, in a portion of a region forming the layout pattern (hereinafter referred to as a chip region) of a semiconductor device of which the layout is designed, the layout of a partial region, i.e. a part of the chip region, may be determined using an automatic arrangement/interconnection software. Moreover, one chip region may have a plurality of such partial regions arranged therein. Furthermore, the pitch with which the circuit patterns are formed may be different for each partial region. In such a case, optimal dummy patterns can be obtained for each of the partial regions if a layout pattern is to be output per partial region. As a result, generation of the region having a non-uniform pattern density can be prevented in the layout pattern.

In the layout designing apparatus according to the above-described one aspect of the present invention, the output unit may output a layout pattern including a peripheral dummy pattern located in a region other than a region occupied by the partial layout pattern, of the region forming the layout pattern.

In this case, the arrangement of the dummy patterns can be optimized in the partial region (the region occupied by the partial layout pattern) in a region forming the layout pattern, and the pattern density can be made uniform for the entire region forming the layout pattern by arranging the peripheral dummy pattern also in the region other than the partial region.

In the layout designing apparatus according to the above-described one aspect of the present invention, the peripheral dummy pattern is arranged based on a repetitive distance determined independently of a distance between the plurality of circuit patterns.

In this case, the repetitive distance or the like can be predetermined for the peripheral dummy pattern, so that the arrangement step of the peripheral dummy pattern can be simplified. Therefore, the time needed for the layout designing using the layout designing apparatus according to the present invention can be shortened.

A layout designing method according to another aspect of the present invention includes the steps of entering a plurality of circuit patterns of a semiconductor device; recognizing positional data of the entered plurality of circuit patterns; producing a dummy pattern group including a plurality of dummy patterns, each of the plurality of dummy patterns being arranged per repetitive distance determined based on the recognized positional data of the circuit patterns; extracting a final dummy pattern including a dummy pattern located in a region other than a region overlapping with the circuit patterns, from the dummy pattern group; and outputting a layout pattern including the extracted final dummy pattern and the circuit patterns.

A case is now considered where dummy patterns are arranged between two adjacent circuit patterns spaced such that the dummy patterns can be arranged in between. In such a case, according to the present invention, the repetitive distance of the dummy patterns is determined based on the positional data of the circuit patterns, so that the repetitive distance can be selected such that the dummy patterns can be arranged between two circuit patterns so as not to overlap with the two circuit patterns. Thus, the dummy patterns can reliably be arranged between the two circuit patterns in the final dummy pattern. Therefore, the region, in which no dummy pattern is arranged even though there is a space for dummy patterns to be arranged, can be reduced. As a result, the pattern density of the layout pattern can be improved while being made uniform.

In the layout designing method according to the above-described another aspect of the present invention, the step of recognizing may include a step of recognizing a pitch in one direction of the circuit patterns; and the step of producing the dummy pattern group may include a step of determining a submultiple distance of the recognized pitch as the repetitive distance.

In this case, the dummy patterns can be arranged with a pitch smaller than the pitch of the circuit patterns in one direction of the circuit patterns, so that the dummy patterns can reliably be arranged between the circuit patterns. Thus, the size of the region where no dummy pattern is arranged between the circuit patterns can be reduced in the final dummy pattern. As a result, the pattern density can be more uniform in the layout pattern.

In the layout designing method according to the above-described another aspect of the present invention, the dummy pattern group may include a plurality of additional dummy patterns located between the plurality of dummy patterns, and the final dummy pattern may include the additional dummy patterns located in a region other than a region overlapping with the circuit patterns.

In this case, the additional dummy patterns will be arranged at positions displaced from the dummy patterns by a distance smaller than the repetitive distance. When convex or concave portions are locally formed in the circuit patterns, it may be difficult to sufficiently improve the pattern density by the dummy patterns alone that are arranged with the above-described repetitive distance, in a region near the portion in which the convex or concave portions are formed as described above.

Thereat, the additional dummy patterns that are arranged at positions displaced from the dummy patterns as described above are applied in such a region. For example, in the region where a convex portion is formed in a circuit pattern, application of the additional dummy patterns displaced from the dummy patterns in the direction away from this convex portion allows the additional dummy patterns to be arranged in this region so as not to overlap with the convex portion, in such a case that the dummy patterns are partially over-lapped with the convex portion as described above. Moreover, when a concave portion is formed in the circuit pattern, the additional dummy patterns can be arranged near the concave portion as described above. Thus, more uniform pattern density can be attained in the layout pattern.

In the layout designing method according to the above-described another aspect of the present invention, each of the plurality of dummy patterns is preferably arranged per repetitive distance using positions of the circuit patterns as a reference.

In this case, the dummy patterns can reliably be arranged between the circuit patterns by using the positions of the circuit patterns as a reference. This can reduce the number of dummy patterns that are partially overlapping with the circuit patterns. Therefore, the region where dummy patterns are formed can be increased in the final dummy pattern, so that a layout pattern having an improved uniformity of the pattern density can be obtained.

In the layout designing method according to the above-described another aspect of the present invention, the step of producing the dummy pattern group may include arrangement of the dummy patterns in a partial region including the circuit patterns, of a region forming a layout pattern, and the step of outputting may include outputting of a layout pattern including a partial layout pattern for the partial region.

As for the layout designing, in a portion of a region forming the layout pattern (chip region) of a semiconductor device of which the layout is designed, the layout of a partial region, i.e. a part of the chip region, may be determined using an automatic arrangement/interconnection software. Moreover, one chip region may have a plurality of such partial regions arranged therein. Furthermore, the pitch with which the circuit patterns are formed may be different for each partial region. In such a case, optimal dummy patterns can be obtained for each of the partial regions if a layout pattern is to be output per partial region.

In the layout designing method according to the above-described another aspect of the present invention, the step of outputting may include outputting of a layout pattern including a peripheral dummy pattern located in a region other than a region occupied by the partial layout pattern of the region forming the layout pattern.

In this case, the arrangement of the dummy patterns can be optimized in the partial region (the region occupied by the partial layout pattern) in a region forming the layout pattern, and the pattern density can be made uniform for the entire region forming the layout pattern by arranging the peripheral dummy pattern also in the region other than the partial region.

In the layout designing method according to the above-described another aspect of the present invention, the peripheral dummy pattern may be arranged based on a repetitive distance determined independently of a distance between the plurality of circuit patterns.

In this case, by predetermining the repetitive distance or the like for the peripheral dummy pattern, the arrangement step of the peripheral dummy pattern can be simplified. Therefore, the time needed for the layout designing using the layout designing apparatus according to the present invention can be shortened.

A semiconductor device according to a further aspect of the present invention is manufactured using the layout designing method according to the above-described another aspect of the present invention.

In such a manner, the pattern density can be made uniform in the layout pattern, and hence interconnections corresponding to the circuit patterns and dummy interconnections corresponding to the dummy patterns can be made more uniform in the interconnection layer or the like corresponding to the layout pattern in the semiconductor device. As a result, when an interlayer insulating film is formed on the interconnections and the dummy interconnections, the flatness of the upper surface of the interlayer insulating film can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
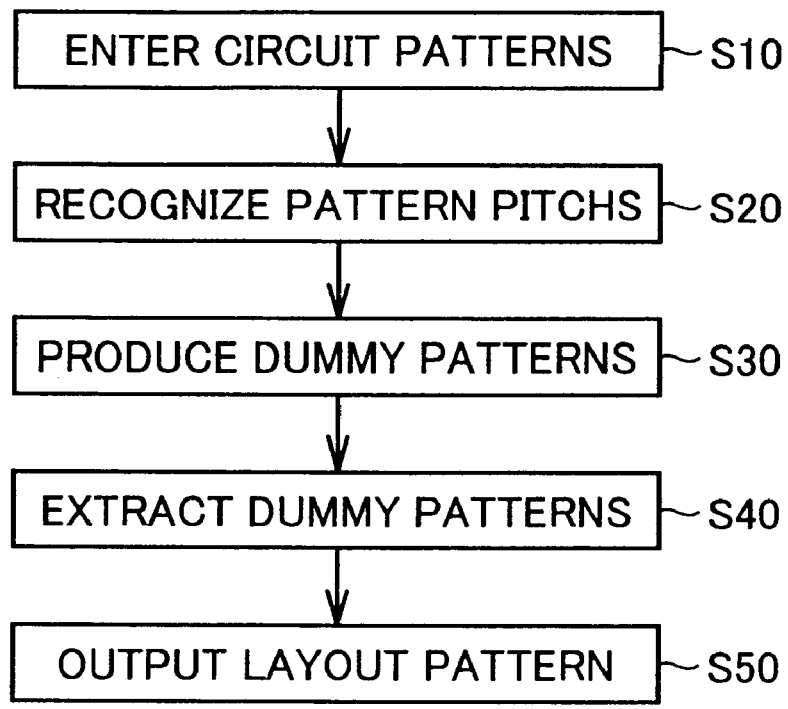
FIG. 1 is a flow chart showing the first embodiment of a layout designing method according to the present invention.

Embodiments of the present invention will be described below with reference to the drawings. It is noted that the same or corresponding portions are denoted by the same reference numbers in the drawings, and the descriptions thereof will not be repeated.

First Embodiment

The first embodiment of a layout designing method according to the present invention will be described with reference to FIGS. 1 to 10.

Referring to FIG. 1, the layout designing method of a semiconductor device according to the present invention is to be used in a layout designing process in the method of manufacturing the semiconductor device. In the layout designing method according to the present invention, first, the step of entering circuit patterns (S10) is executed entering the circuit patterns obtained based on circuit diagrams determined through the processes of logic designing and logic verifying of the semiconductor device. Here, in the layout designing of a semiconductor device such as a semiconductor integrated circuit, an automatic arrangement/interconnection technique is used in that the patterns of macro cells having small functions are arranged within the semiconductor device (chip) and interconnection patterns connecting terminals of the macro cells to each other are automatically. arranged. In such an automatic arrangement/interconnection technique, interconnection patterns having predetermined widths are produced on interconnection tracks that are defined to be arranged by equal intervals in a predetermined direction. The automatic arrangement/interconnection technique determines the coordinates of circuit patterns $1a$ to $1c$, i.e. the interconnection patterns.

Figure 4:
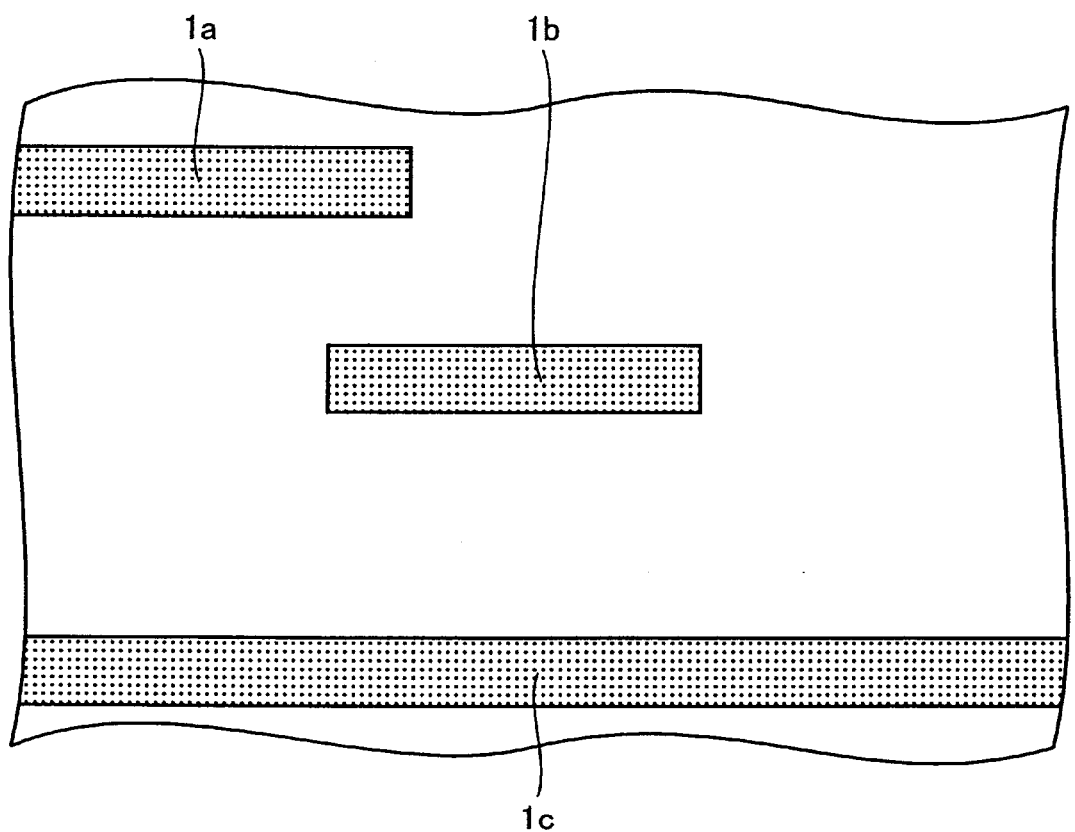
FIGS. 4 to 8 are schematic views illustrating each of the steps in the layout designing method shown in FIG. 1.

By the step of entering circuit patterns (S10), the positional coordinate data of circuit patterns $1a$ to $1c$ such as the interconnection patterns of the semiconductor device are read into a memory 13 (see FIG. 9) of a layout pattern designing apparatus. FIG. 4 shows positions of the entered circuit patterns $1a$ to $1c$ on the layout pattern.

Figure 2:
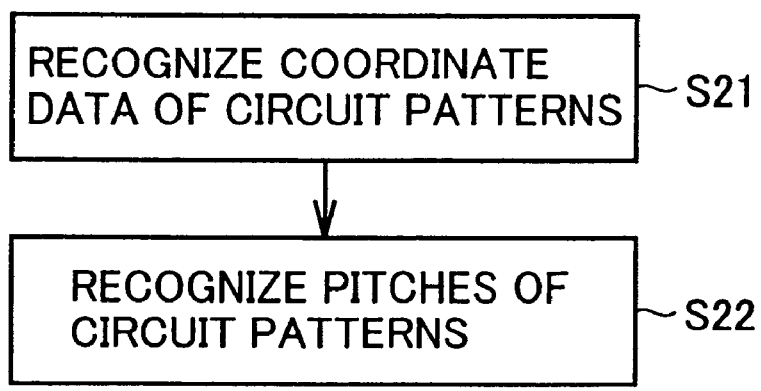
FIG. 2 is a flow chart illustrating the step of recognizing pattern pitches shown in FIG. 1.

Next, in the step of recognizing pattern pitches (S20), first, the step of recognizing the coordinate data of circuit patterns $1a$ to $1c$ (S21) is executed as shown in FIG. 2. Thereafter, the step of recognizing pitches of circuit patterns 1a to 1c are executed based on the recognized coordinate data of circuit patterns 1a to 1c. Specifically, in the pattern shown in FIG. 5, for example, a pitch P1 between circuit patterns 1a and 1b, and a pitch P2 between circuit patterns 1b and 1c are detected. Recognition of such pitches P1 and P2 (pattern pitches) is executed in an operation unit 12 based on the coordinate data of circuit patterns 1a to 1c that are taken into memory 13. It is noted that a width W of circuit patterns 1a to 1c is determined by a process condition such as a minimum processing dimension of the photolithographic processing in the manufacturing process of the semiconductor device.

Figure 3:
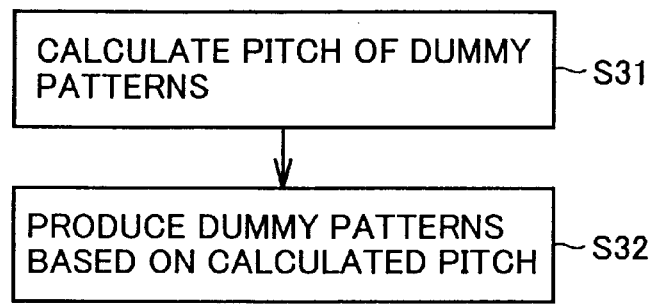
FIG. 3 is a flow chart illustrating the step of producing dummy patterns shown in FIG. 1.

Subsequently, the step of producing dummy patterns (S30) is executed. In the step of producing dummy patterns (S30), the step of calculating a dummy pattern pitch P (S31), i.e. a pitch for the dummy patterns, obtained by equally dividing pitches P1 or P2 into two or more is executed, as shown in FIG. 3, based on pitches P1 and P2 of circuit patterns 1a to 1c detected in the step of recognizing pattern pitches (S20). For example, in the case of circuit patterns 1a to 1c shown in FIG. 5, dummy pattern pitch P is determined so as to have a length of a half the length of pitch P1 or of a third the length of pitch P2.

Figure 5:
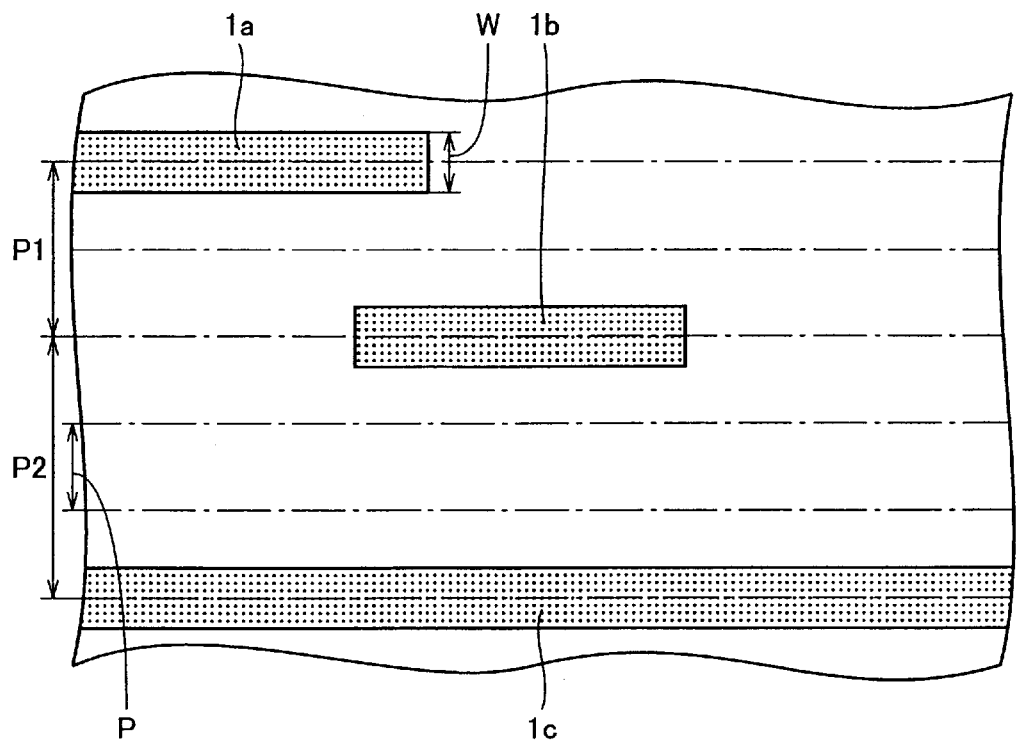
Figure 6:
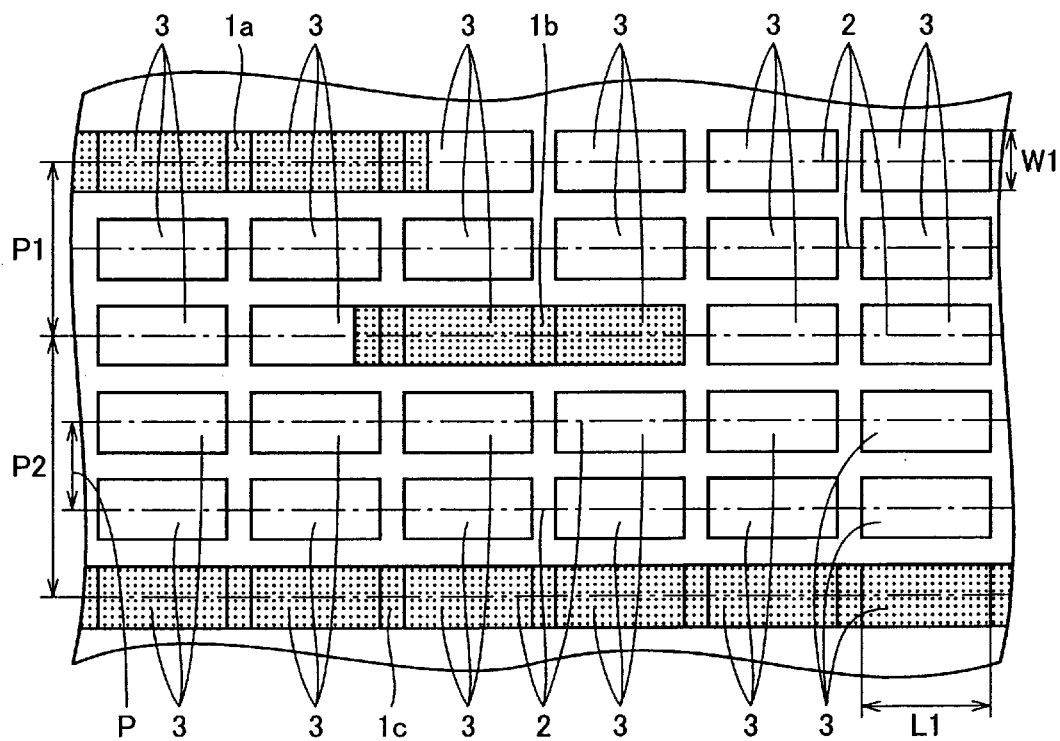
Figure 7:
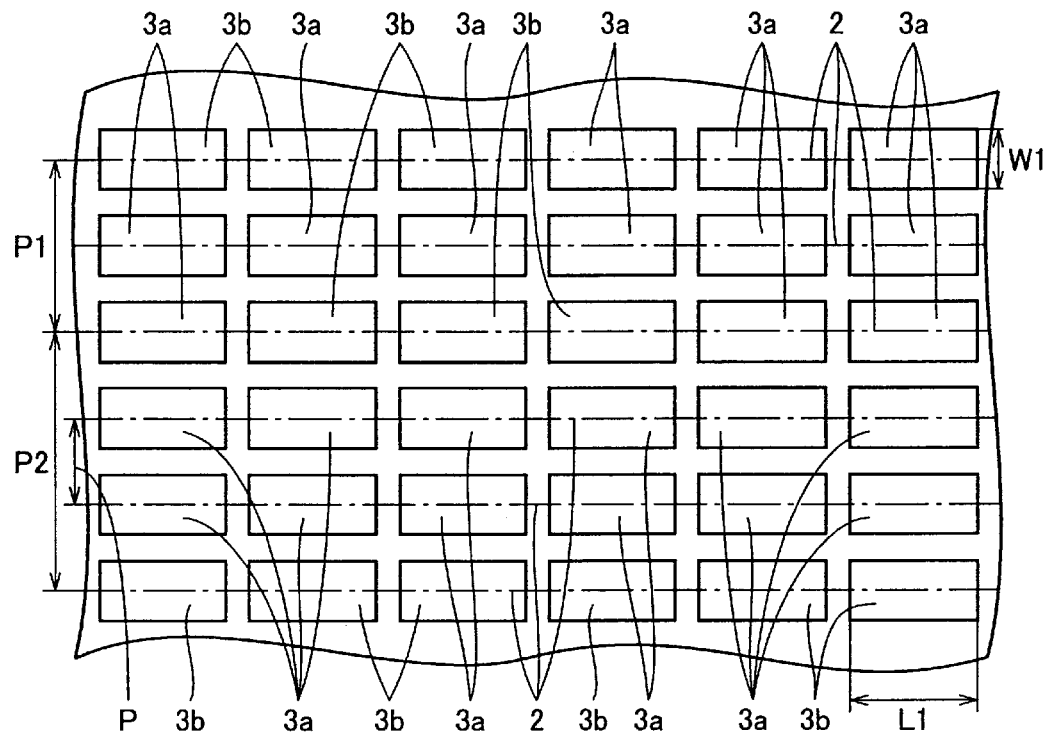

Thus, dummy patterns 3 can be arranged with dummy pattern pitch P which is smaller than pitches P1 and P2 of circuit patterns 1a to 1c in the vertical direction (the direction perpendicular to a pitch additional line 2) in FIG. 5, which is one direction of circuit patterns 1a to 1c. This allows dummy patterns 3 to be reliably arranged between circuit patterns 1a to 1c. Thus, the region where no dummy pattern 3a is arranged between circuit patterns 1a to 1c can be reduced in size in a final dummy pattern. This results in more uniform pattern density in the layout pattern.

Pitch additional lines 2 are defined on the layout, spaced from each other by a distance of dummy pattern pitch P. Pitch additional lines 2 are arranged relative to the center lines of circuit patterns 1a to 1c such that they overlap with circuit patterns 1a to 1c.

In this case, dummy patterns 3 are arranged along pitch additional lines 2 as will be described later, so that dummy patterns 3 can reliably be arranged between circuit patterns 1a to 1c. Thus, the number of dummy patterns 3b partially overlapping with circuit patterns 1a to 1c can be reduced. Therefore, the region in which dummy patterns 3a are formed can be increased in size in the final dummy pattern.

It is noted that the step of calculating the pitch of dummy patterns (S31) may be executed as a part of the step of recognizing pattern pitches (S20).

Next, in the step of producing dummy patterns (S30), subsequent to the step of calculating the pitch of dummy patterns (S31) described above, the step of arranging dummy patterns 3 each having a width W1 and a length L1 (see FIG. 6) in a matrix is executed such that the patterns are along pitch additional lines 2. Here, width W1 of dummy patterns 3 has the almost same dimension as width W (see FIG. 5) of circuit patterns 1a to 1c. As further can be seen from FIG. 6, the distance between the centers of vertically adjacent dummy patterns 3 is equal to dummy pattern pitch P.

Subsequently, the step of extracting dummy patterns (S40) extracting dummy patterns 3a (see FIG. 7) each located in a region that is a predetermined distance away from any of circuit patterns 1a to 1c, as dummy patterns constituting the final dummy pattern. As can be further seen from FIG. 7, dummy patterns 3b having portions overlapping with circuit patterns 1a to 1c are not selected as the dummy patterns constituting the final dummy pattern.

Figure 8:
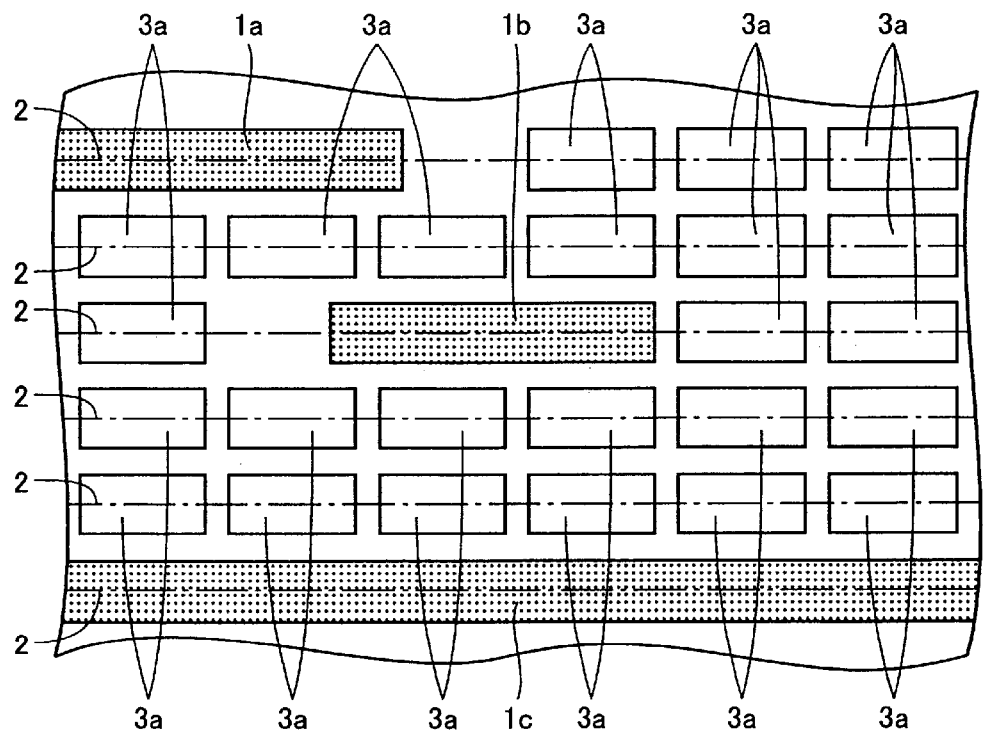

Thereafter, the step of outputting a layout pattern (S50) including dummy patterns 3a constituting the final dummy pattern extracted in the step of extracting dummy patterns (S40) and including circuit patterns 1a to 1c is executed. The final layout pattern obtained here will be a layout pattern as shown in FIG. 8.

As such, according to the present invention, the repetitive distance of dummy patterns 3a is determined based on the positional data of circuit patterns 1a to 1c in the step of recognizing pattern pitches (S20) and in the step of producing dummy patterns (S30), so that dummy pattern pitch P, i.e. a repetitive distance in which dummy patterns 3 can be arranged so as not to overlap with circuit patterns 1a to 1c, can be determined between circuit patterns 1a to 1c. This allows dummy patterns 3a to be reliably arranged between circuit patterns 1a to 1c in the layout pattern. Therefore, the region where no dummy pattern is arranged even though there is a space for dummy patterns 3 to arranged thereat can be reduced. As a result, a layout pattern having a more uniform pattern density compared to that in the conventional case can be obtained.

Subsequently, the obtained layout pattern is verified if a predetermined circuit property can be attained by the layout pattern, or if the layout pattern satisfies the design rule. Thereafter, a pattern of a photomask to be used in the exposure step is formed based on this layout pattern. The photolithographic processing in the manufacturing process of the semiconductor device is executed using the photomask having such a pattern, and hence a semiconductor device with the structure shown in FIG. 9 is manufactured.

Figure 9:
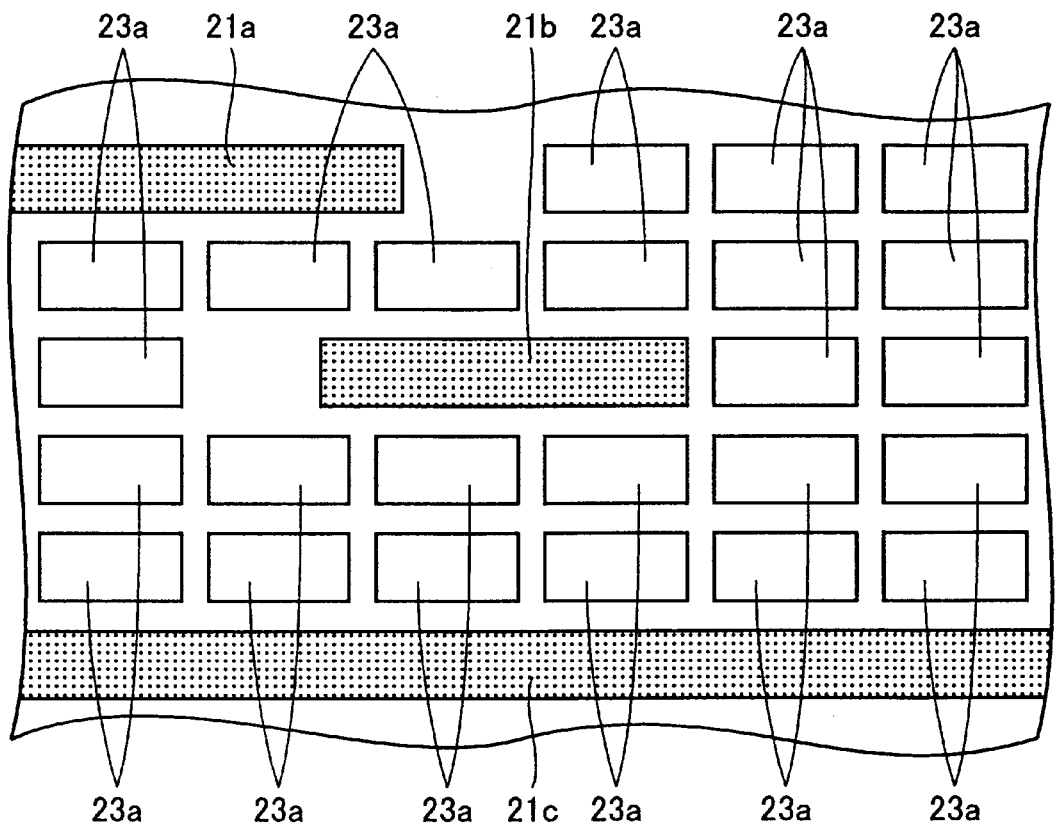
FIG. 9 is a schematic plan view of a semiconductor device manufactured in accordance with the layout pattern shown in FIG. 8.

Referring to FIG. 9, in the semiconductor device manufactured using the layout designing method according to the present invention, interconnections 21a to 21c are formed on an interlayer insulating film formed on the semiconductor substrate, based on circuit patterns 1a to 1c. Further, dummy interconnections 23a formed based on dummy patterns 3a are arranged in a region where none of interconnections 21a to 21c is formed.

Thus, in the semiconductor device according to the present invention, by making the pattern density in the layout pattern uniform, the pattern density can be made more uniform for interconnections 21a to 21c corresponding to circuit patterns 1a to 1c and for dummy interconnections 23a corresponding to dummy patterns 3a, in a layer including interconnections 21a to 21c corresponding to the layout pattern in the semiconductor device. As a result, the flatness on the upper surface of the interlayer insulating film can be improved when the interlayer insulating film is formed on interconnections 21a to 21c and dummy interconnections 23a.

Figure 10:
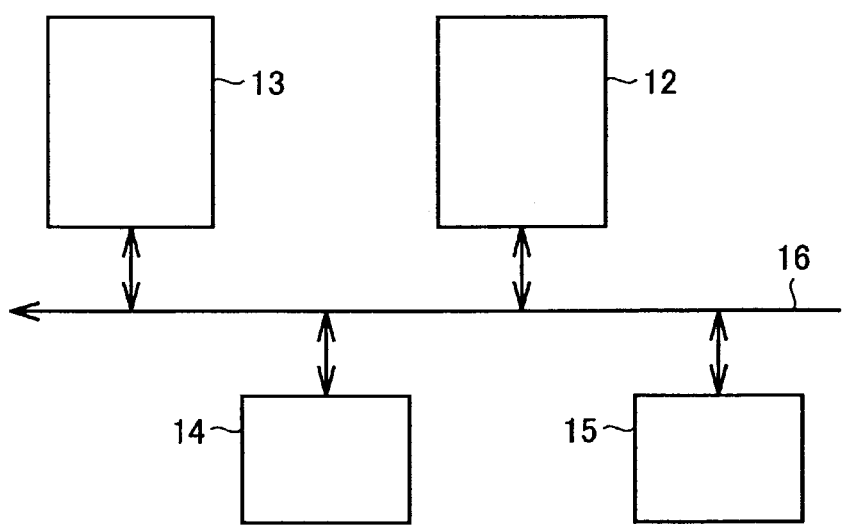
FIG. 10 is a schematic view showing a configuration of a layout designing apparatus for executing the first embodiment of the layout designing method according to the present invention.
Figure 11:
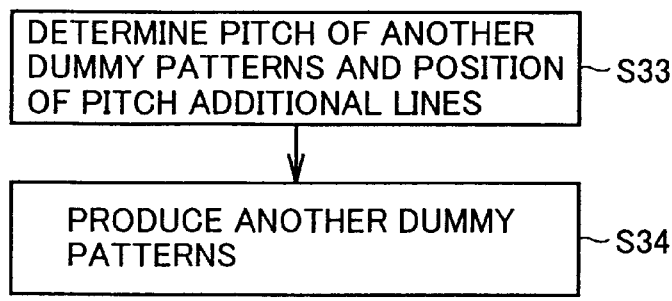
FIGS. 11 and 12 are flow charts showing the second embodiment of the layout designing method according to the present invention.

Furthermore, the layout designing method described with reference to FIGS. 1 to 8 is carried out using a layout designing apparatus shown in FIG. 10. Referring to FIG. 10, the layout designing apparatus is made for designing the layout of a semiconductor device using a computer, and includes a memory 13 into which the positional data of circuit patterns 1a to 1c, the positional data of dummy patterns, and so forth are stored; a central processing unit 12 executing the steps in the layout designing method as described earlier by operating the data stored in memory 13, and including a recognition unit, a dummy pattern arrangement unit and an extraction unit; an entry device 14 as an entry unit such as a keyboard, a mouse or a CD-ROM drive entering or collecting the data; and an output device 15 as an output unit such as a display or a printer for outputting the data of the layout pattern or the other data. Memory 13, central processing unit 12, entry device 14 and output device 15 are connected to each other by a bus 16.

Such a layout designing apparatus facilitates execution of the layout designing method according to the present invention.

Second Embodiment

In the automatic arrangement/interconnection technique for interconnections or the like described in the first embodiment of the present invention may allow an interconnection pattern to be located at a position displaced from an interconnection track by half the distance of the pitch of the interconnection track (half pitch) in order to enhance the degree of freedom of an interconnection path. Even in such a case, using the second embodiment of the layout designing method according to the present invention described below, dummy patterns can be produced to have a uniform pattern density.

Figure 12:
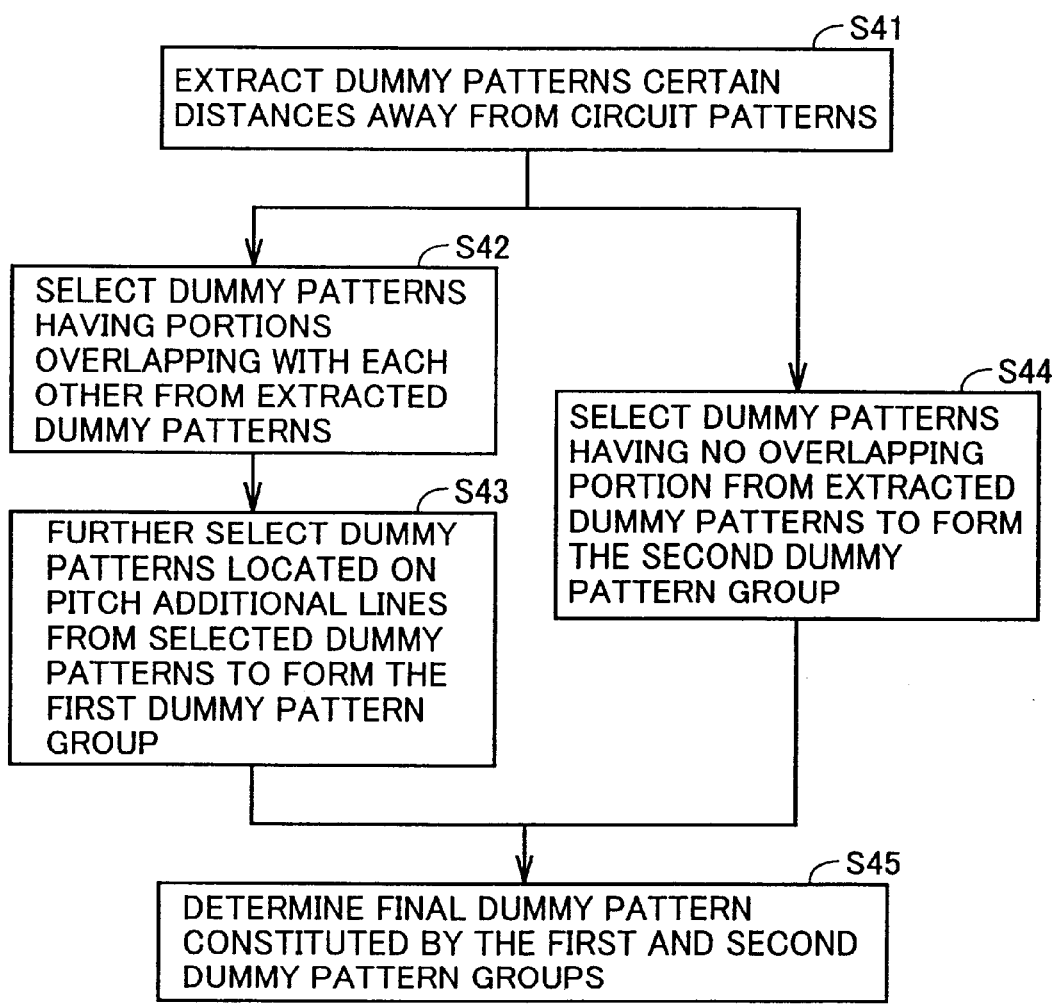

Referring to FIGS. 11 to 21, the second embodiment of the layout designing method according to the present invention will be described. It is noted that FIG. 11 corresponds to the step of producing dummy patterns (S30) shown in FIG. 1. FIG. 12 corresponds to the step of extracting dummy patterns (S40) shown in FIG. 1.

Figure 13:
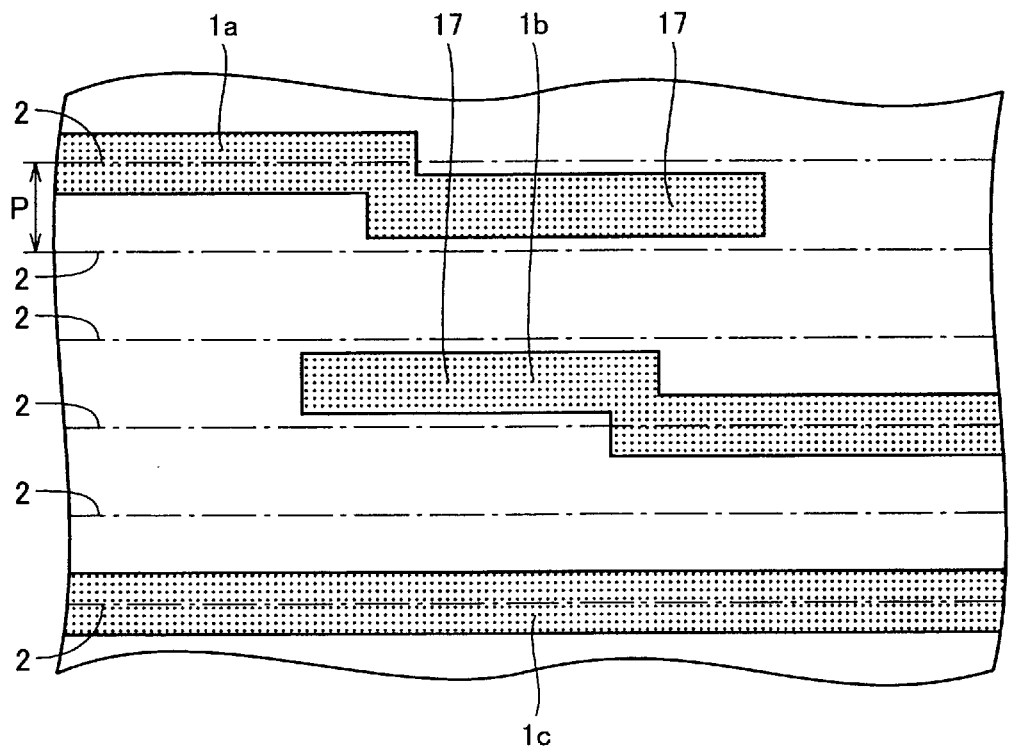
FIGS. 13 to 21 are schematic views illustrating each step in the second embodiment of the layout designing method according to the present invention.

The second embodiment of the layout designing method according to the present invention is basically similar to the layout designing method according to the first embodiment of the present invention. First, as in the layout designing method according to the first embodiment of the present invention, the step of entering circuit patterns (S10) and the step of recognizing pattern pitches (S20) are executed. As a result, the coordinate data of circuit patterns 1a to 1c are taken into the layout designing apparatus according to the present invention, as shown in FIG. 13.

Subsequently, the step of producing dummy patterns (S30) in the first embodiment of the present invention is executed. In the step of producing dummy patterns (S30), as in the case with the first embodiment of the present invention, the step of determining dummy pattern pitch P (S31) based on the intervals (pitches) between circuit patterns 1a to 1c (see FIG. 3) is executed as the first step in the step of producing dummy patterns. Here, as shown in FIG. 13, each of circuit patterns 1a and 1b has a portion 17 as a convex portion arranged at a position displaced from the interconnection track by a half pitch. Then, Pitch additional lines 2 are defined based on the dummy pattern pitch P, as in the first embodiment of the present invention.

Figure 14:
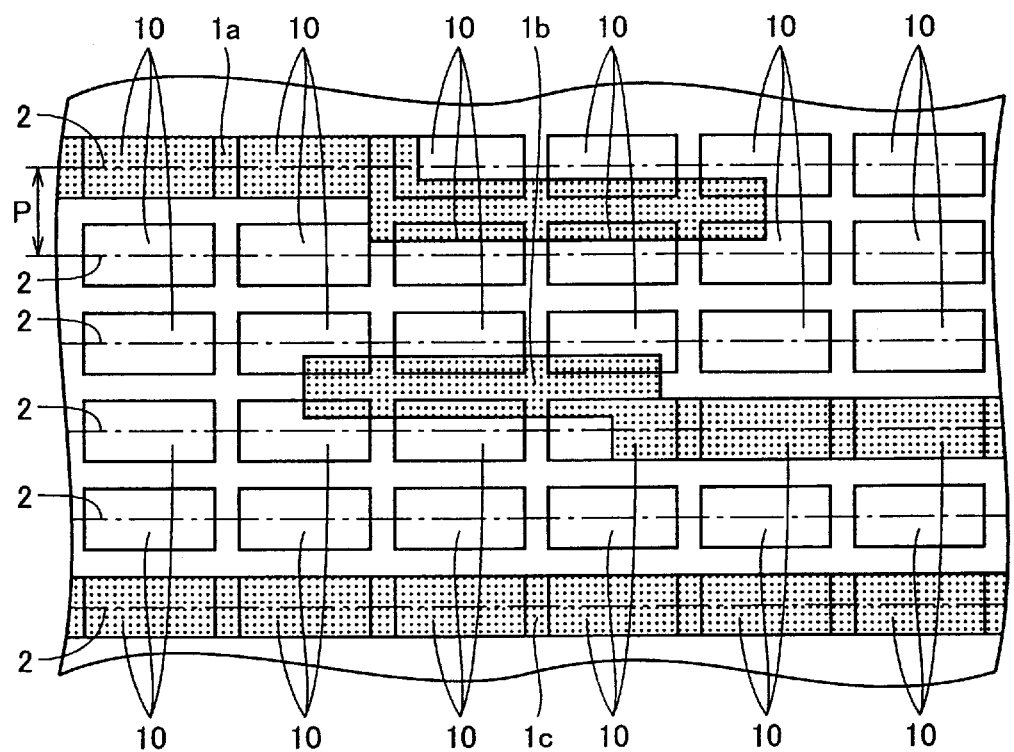

Next, in the step of producing dummy patterns (S30), the step of producing the first dummy patterns 10 located on pitch additional lines 2 as shown in FIG. 14 is executed as the second step in the step of producing dummy patterns. The step of producing the first dummy patterns 10 is basically similar to the step of producing dummy patterns (S32) in the first embodiment of the present invention. The shape of each of the first dummy pattern 10 is basically similar to the shape of each of dummy patterns 3 in the first embodiment of the layout designing method according to the present invention.

Subsequently, in the step of producing dummy patterns (S30) according to the second embodiment of the present invention, sub pitch additional lines 4 (see FIG. 15) are defined, which are located between pitch additional lines 2, extending in parallel with the pitch additional lines 2 at a position away from pitch additional lines 2 by the distance of P/2, and are formed to have the same intervals as the intervals (pitches) of pitch additional lines 2. These sub pitch additional lines 4 are used to arrange the second dummy patterns (other dummy patterns). Thus, the step of determining the pitch of other dummy patterns and the positions of sub pitch additional lines (S33) is executed as the third step in the step of producing dummy patterns.

Figure 15:
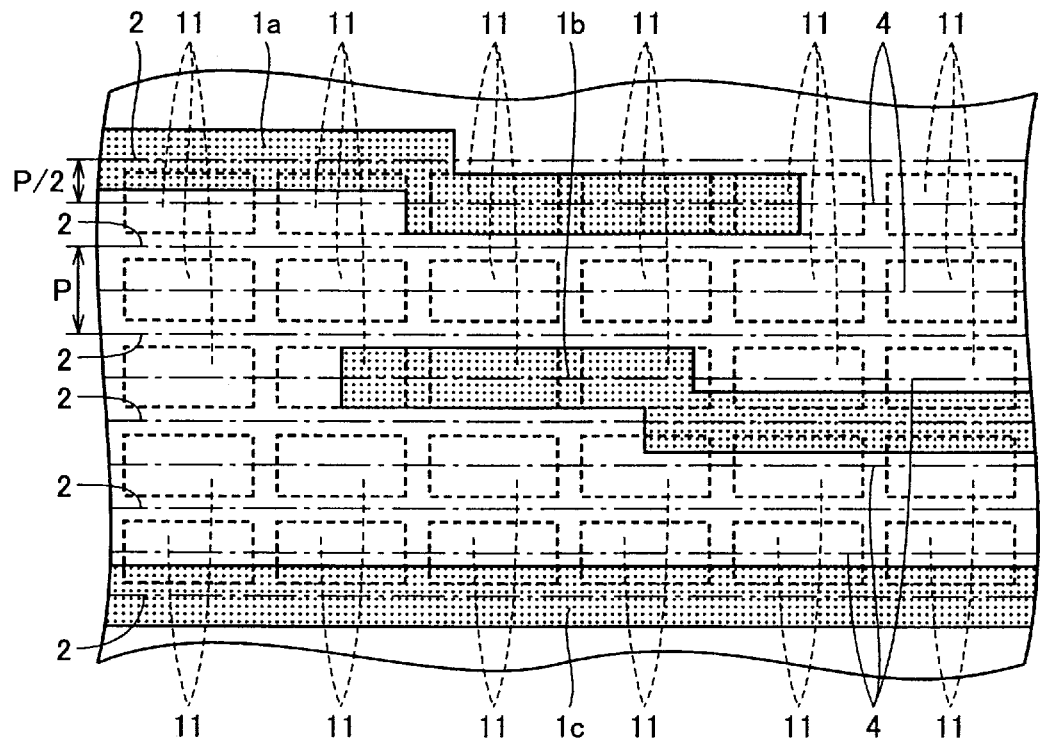

Next, as shown in FIG. 15, the second dummy patterns 11 are arranged so as to be located on sub pitch additional lines 4. As such, the step of producing the second dummy patterns (other dummy patterns) (S34) is executed as the fourth step in the step of producing dummy patterns. The shape of each second dummy pattern 11 is also basically similar to the shape of each dummy pattern 3 in the first embodiment of the layout pattern designing method according to the present invention. Here, as also can be seen from FIGS. 14 and 15, the first dummy patterns 10 and the second dummy patterns 11 are arranged such that they partially overlap with each other. The step of producing dummy patterns (S30) according to the second embodiment of the present invention is thus executed.

Figure 16:
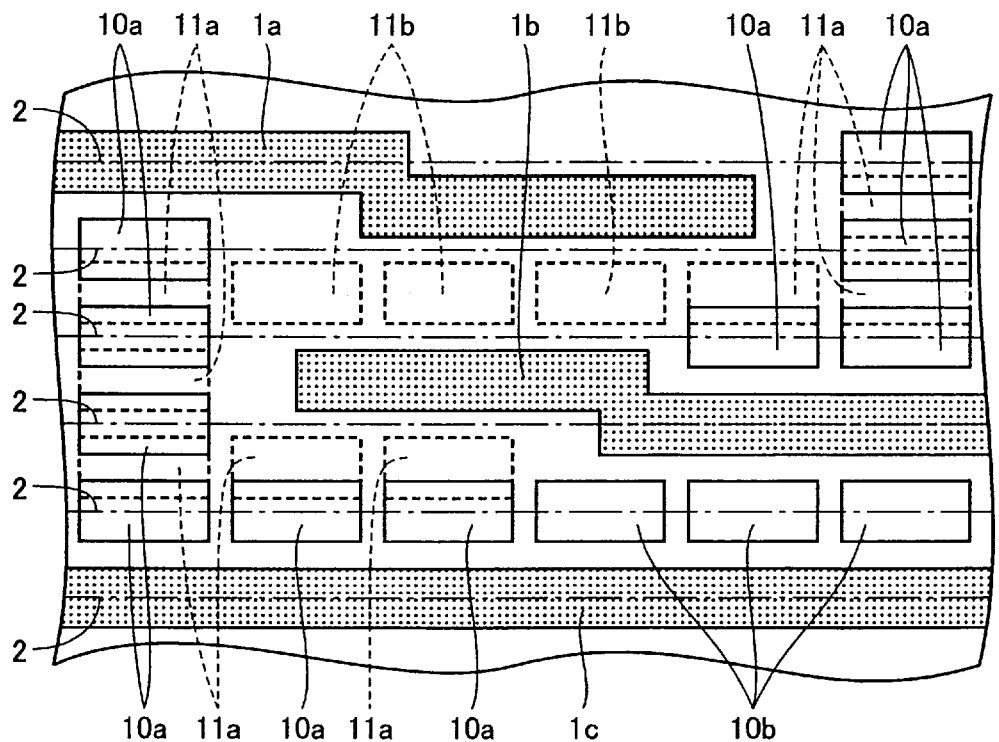

Subsequently, the step of extracting dummy patterns (S40) is executed. The step of extracting dummy patterns in the layout designing method according to the present invention specifically includes the steps shown in FIG. 12. Referring to FIG. 12, in the step of extracting dummy patterns (S40), the step of extracting the first and the second dummy patterns 10a, 10b, 11a and 11b (see FIG. 16) that are spaced by a predetermined distance from circuit patterns 1a to 1c (S41) is first executed. As a result, the first dummy patterns 10a, 10b and the second dummy patterns 11a, 11b are extracted as shown in FIG. 16. As can also be seen from FIG. 16, the dummy patterns having regions overlapping with circuit patterns 1a to 1c are not extracted.

Figure 17:
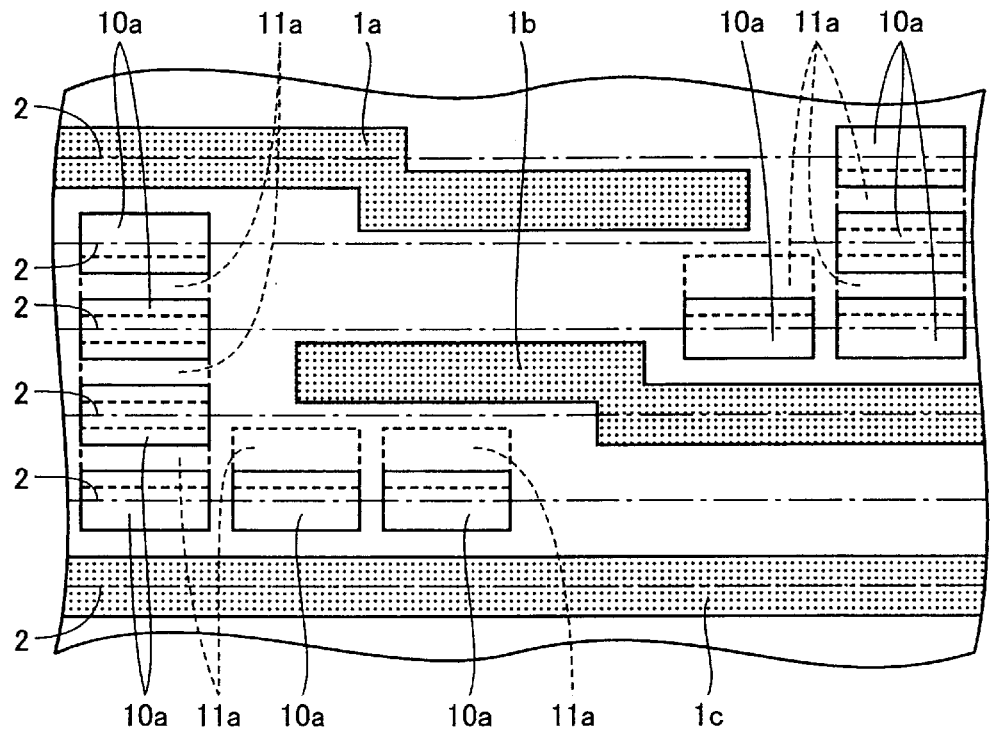

Thereafter, the step of selecting dummy patterns having portions overlapping with each other from the extracted first and second dummy patterns 10a, 10b, 11a and 11b (S42) is executed. As a result, as shown in FIG. 17, the first dummy patterns 10a and the second dummy patterns 11a are selected.

Figure 18:
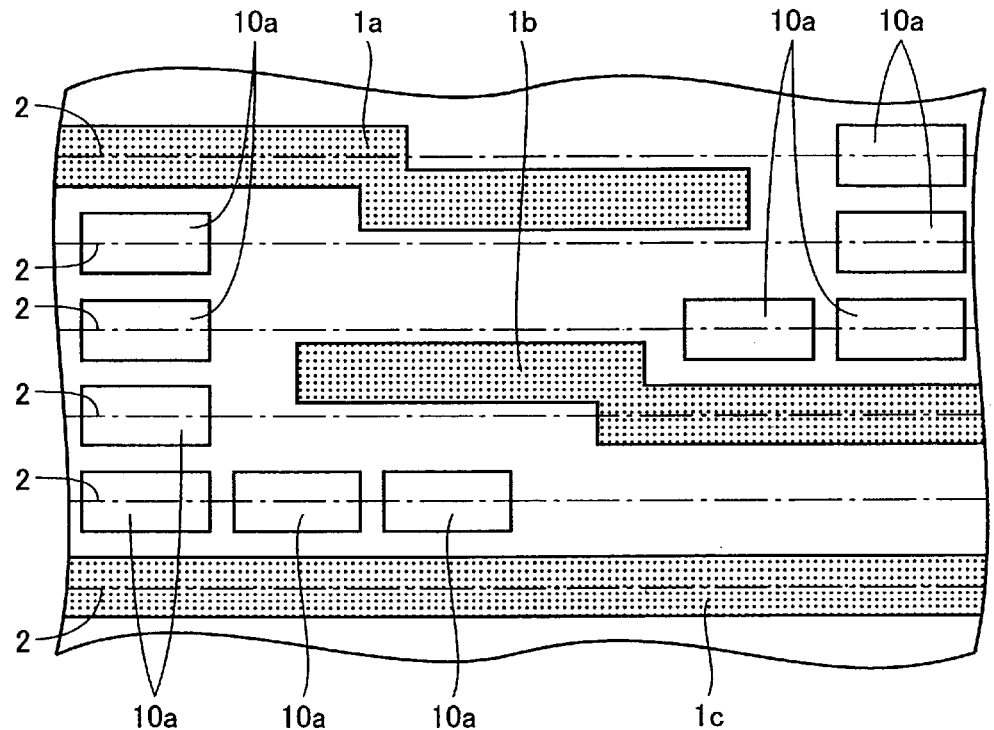

Subsequently, the step of further selecting the first dummy patterns 10a located on pitch additional lines 2 from the selected first and second dummy patterns 10a, 11a, as a first dummy pattern group, (S43) is executed. As a result, a pattern shown in FIG. 18 is obtained. As such, in the portion where the first dummy patterns 10a and the second dummy patterns 11a are partially overlapped with each other, the overlapping of dummy patterns can be dissolved so that the first dummy pattern group as shown in FIG. 18 can be obtained. It is noted that, though the first dummy patterns 10a located on pitch additional lines 2 were selected here as the first dummy pattern group, the second dummy patterns 11a located on sub pitch additional lines 4 may also be selected as the first dummy pattern group.

Figure 19:
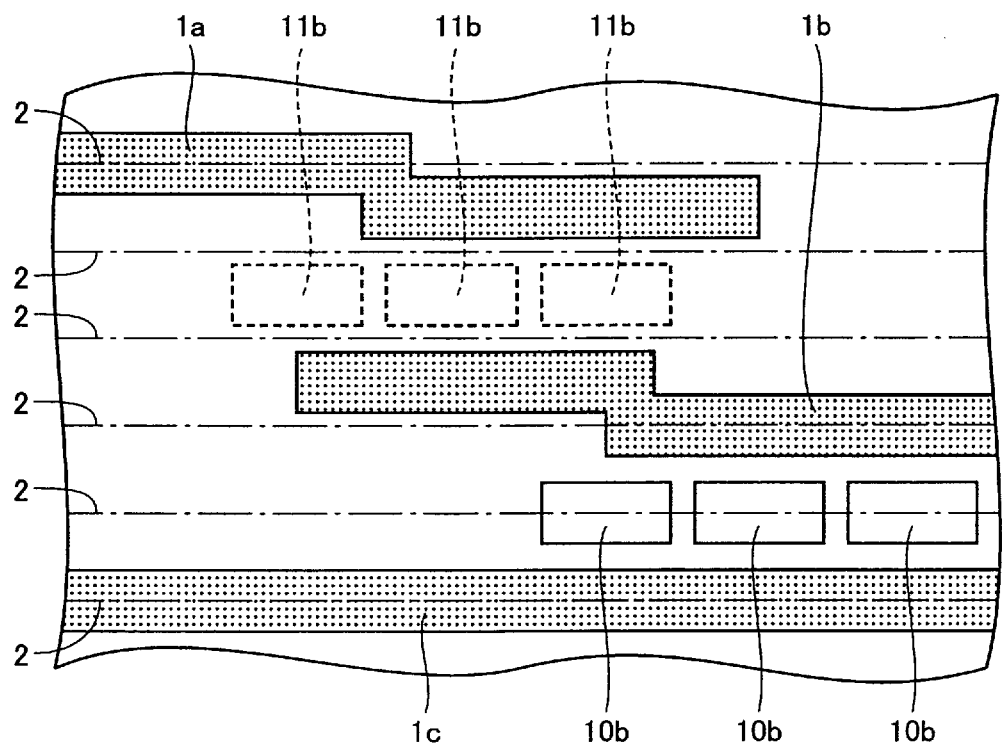

Furthermore, after the step of extracting the dummy patterns that are a certain distance or farther away from circuit patterns 1a to 1c (S41), the step of selecting dummy patterns having no overlapping portion from the extracted first and second dummy patterns 10a, 10b, 11a and 11b, as the second dummy pattern group (S44) is executed. As a result, as shown in FIG. 19, the first dummy patterns 10b and the second dummy patterns 11b having no overlapping portion with the other dummy patterns are selected from the extracted first and second dummy patterns 10a, 10b, 11a and 11b, as the second dummy pattern group.

Figure 20:
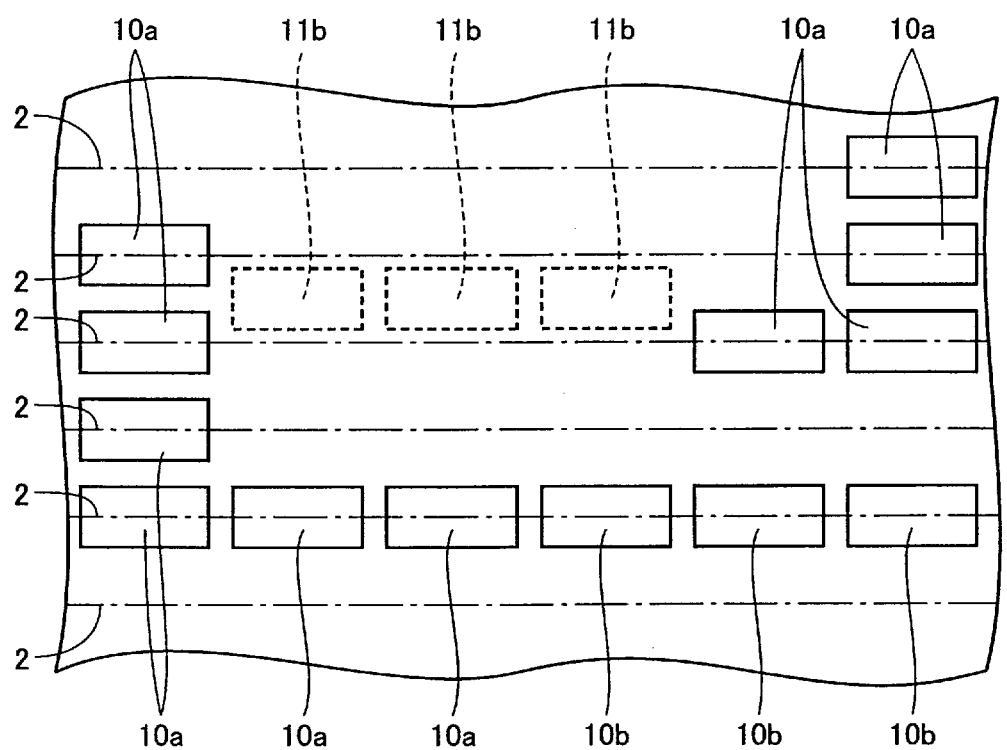

Subsequently, the step of determining the final dummy pattern including the first and second dummy pattern groups described above (S45) is executed. As a result, as shown in FIG. 20, the final dummy pattern is determined including dummy patterns 10a as the first dummy pattern group and dummy patterns 10b, 11b as the second dummy pattern group. The step of extracting dummy patterns is thus executed.

Thereafter, as in the first embodiment of the present invention, the step of outputting the layout pattern (S50) outputting the layout pattern including the final dummy pattern and circuit patterns is executed. As a result, the layout pattern as shown in FIG. 21 can be obtained.

In such a case where each of circuit patterns 1a and 1b has a portion 17 locally formed therein as a convex portion, it is difficult to sufficiently improve the pattern density in the region near the portion 17 by dummy patterns 10 alone, which are formed along pitch additional lines 2 in the first embodiment of the present invention. For example, between circuit patterns 1a and 1b, as can also be seen from FIG. 16, any of the first dummy patterns 10 formed along pitch additional lines 2 will have portions overlapping with circuit patterns 1a, 1b. Therefore, none of the first dummy patterns 10 remains in this region for the final dummy pattern.

By assuming sub pitch additional lines 4 and applying the second dummy patterns 11 as the additional dummy patterns arranged at positions displaced from the first dummy patterns 10 as in the second embodiment of the layout designing method according to the present invention, it is possible to arrange dummy patterns 11b between circuit patterns 1a and 1b as described above in the final dummy pattern. As such, more uniform pattern density in the layout pattern can be attained.

Figure 21:
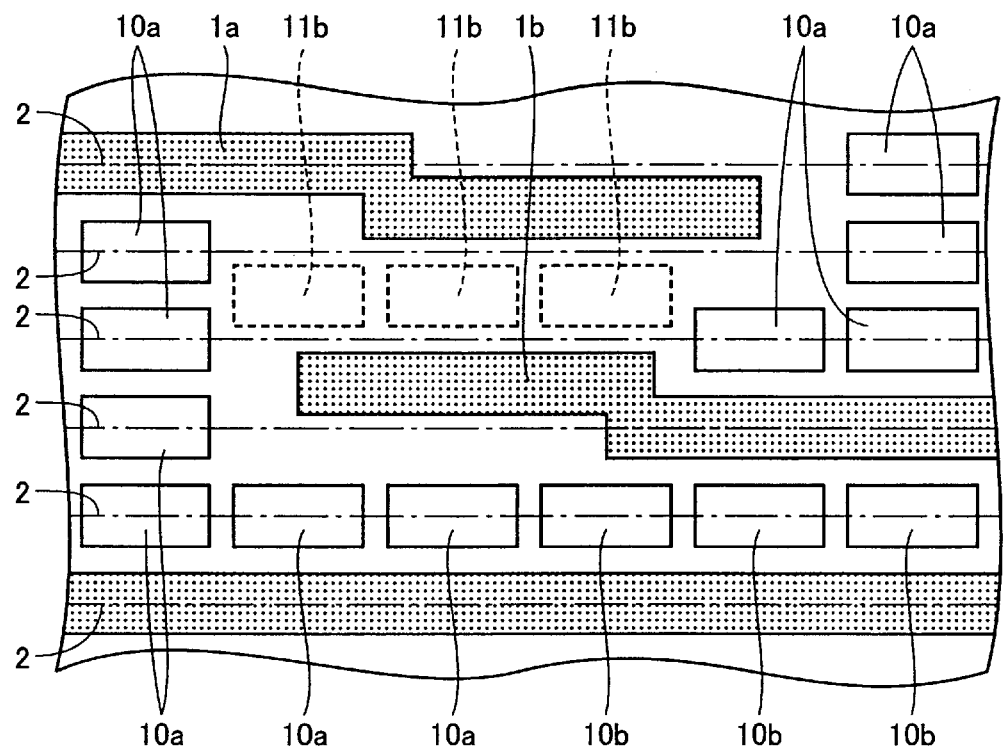

Further, by forming a transfer pattern on a photomask based on the layout pattern shown in FIG. 21 and performing the photolithographic processing in the manufacturing process of the semiconductor device using the photomask, a semiconductor device having a structure corresponding to the layout pattern shown in FIG. 21 can be attained as in the case with the first embodiment of the present invention.

Third Embodiment

Figure 22:
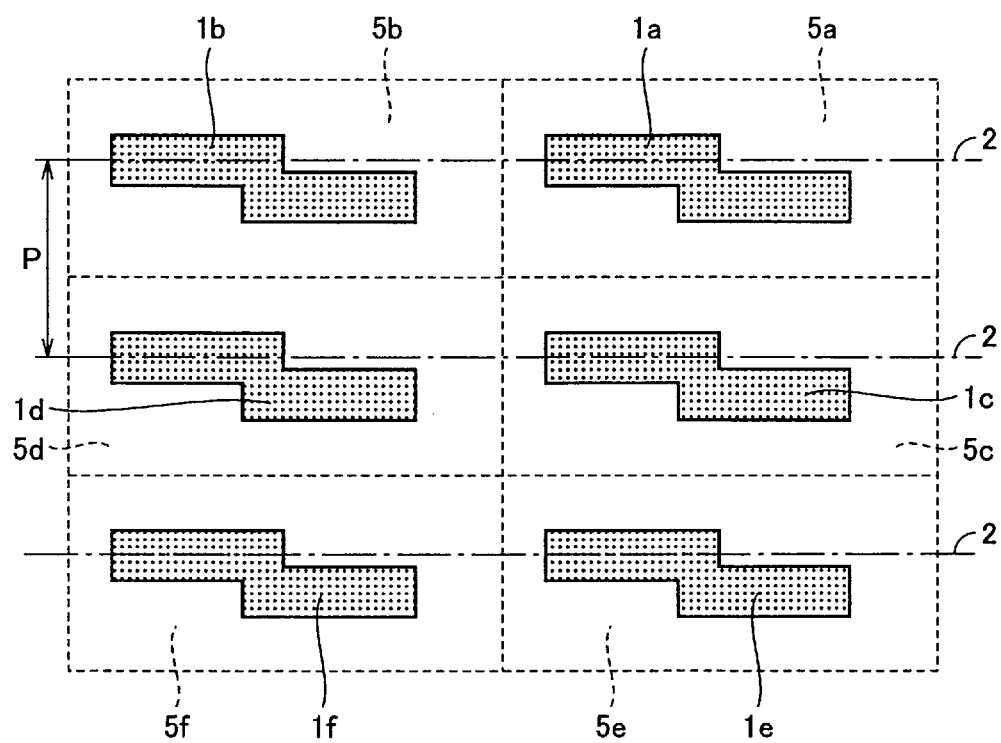
FIGS. 22 to 24 are schematic views illustrating each step in the third embodiment of the layout designing method according to the present invention.
Figure 23:
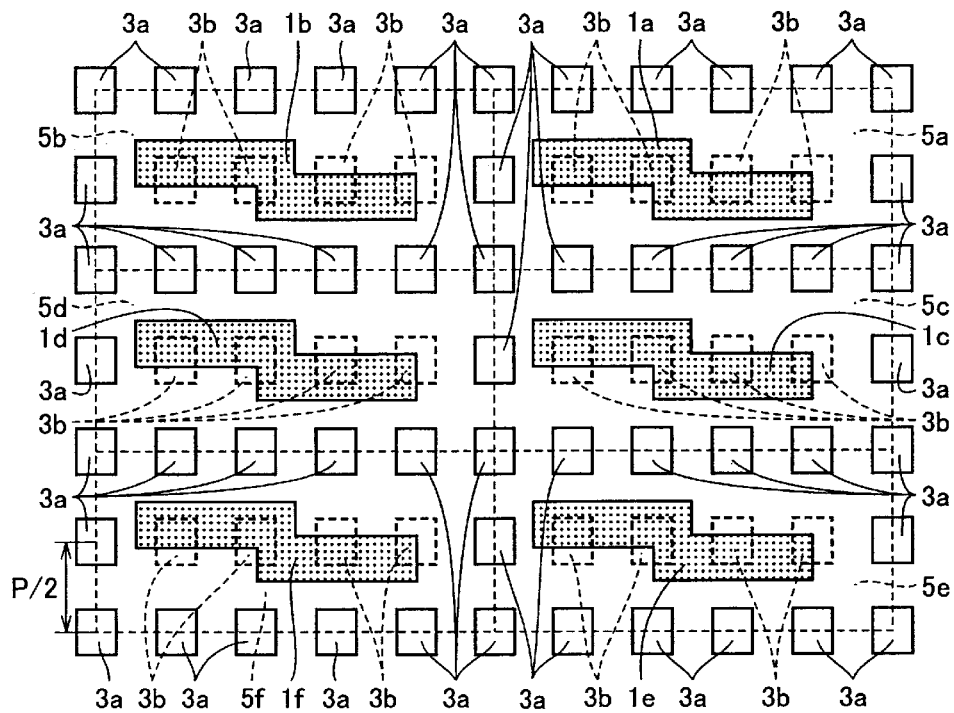
Figure 24:
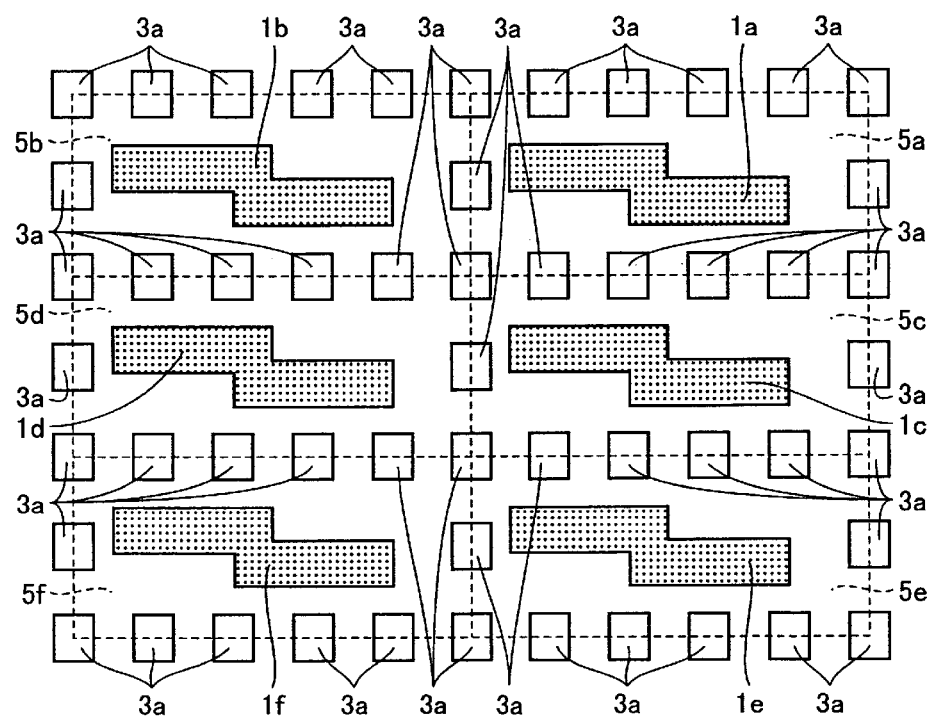

In the layout designing of a semiconductor device having a high regularity such as a semiconductor memory device, e.g. a DRAM (Dynamic Random Access Memory), the layout may be created by arranging macro cells having small functions in a two-dimensional array. The layout designing method according to the present invention can also be applied to such a case. Referring to FIGS. 22 to 24, the third embodiment of the layout designing method according to the present invention will be described.

The third embodiment of the layout designing method according to the present invention basically includes the steps similar to those in the layout designing method according to the first embodiment of the present invention shown in FIG. 1. In the step of entering circuit patterns (S10), circuit patterns 1a to 1f as shown in FIG. 22 are entered. Here, macro cells 5a to 5f are arranged in the two-dimensional array (in a matrix), so that circuit patterns 1a to 1f will be arranged spaced from each other by a pitch P corresponding to the pitches of macro cells 5a to 5f.

Next, in the step of recognizing pattern pitches (S20), pitch P of circuit patterns 1a to 1f is recognized.

Subsequently, in the step of producing dummy patterns (S30), dummy patterns 3a, 3b arranged in a matrix in a manner such that the centers thereof are spaced from each other by half the pitch P (P/2) of the circuit patterns, which was recognized in the step of recognizing pattern pitches (S20). As a result, dummy patterns 3a and 3b are arranged in regions where macro cells 5a to 5f are arranged as shown in FIG. 23. The pitch of dummy patterns 3a, 3b is half the pitch P (P/2) of the circuit patterns.

Subsequently, in the step of extracting dummy patterns (S40), dummy patterns 3a formed in regions that are certain distances away from circuit patterns 1a to 1f, i.e. the region where there is no overlapping, is extracted as dummy patterns constituting the final dummy pattern.

Thereafter, in the step of outputting a layout pattern (S50), as shown in FIG. 24, a layout pattern, constituted by circuit patterns 1a to 1f and dummy patterns 3a extracted in the step of extracting dummy patterns (S40) as the dummy patterns constituting the final dummy pattern, is output.

In such a manner, the effect similar to that in the first embodiment of the present invention can be attained. Furthermore, by forming a transfer pattern on a photomask based on the layout pattern shown in FIG. 24 and performing the photolithograhic processing in the manufacturing process of the semiconductor device using the photomask, a semiconductor device having a structure corresponding to the layout pattern shown in FIG. 24 can be obtained as in the case with the first embodiment of the present invention.

Fourth Embodiment

Figure 25:
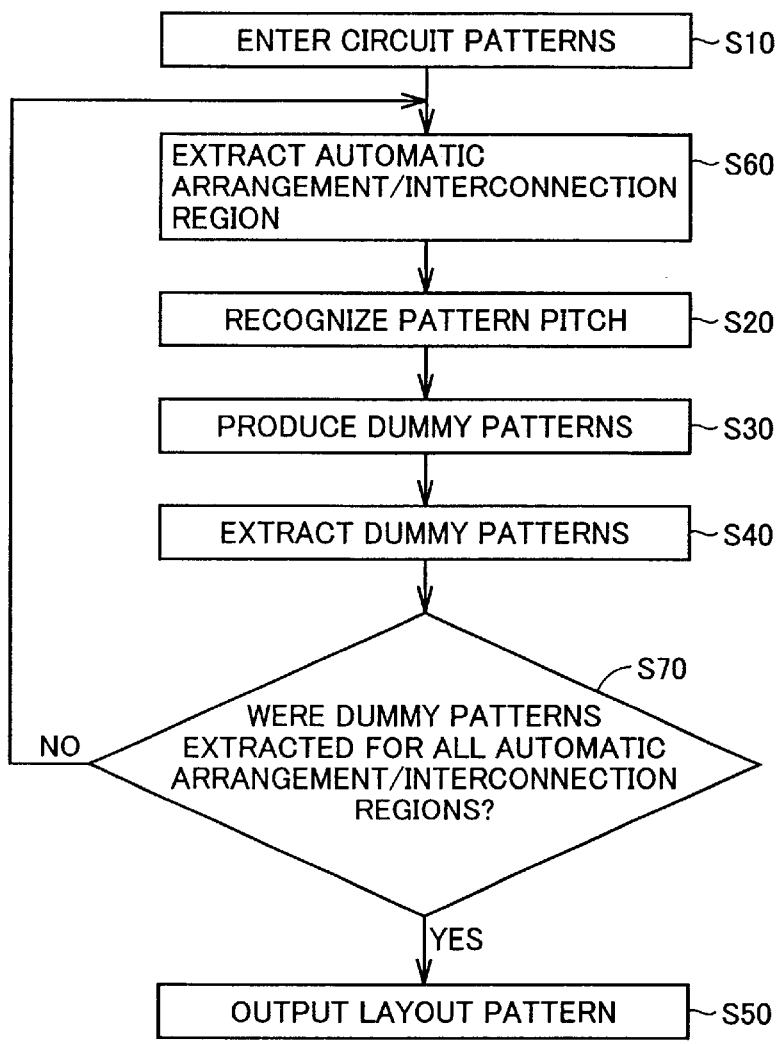
FIG. 25 is a flow chart showing the fourth embodiment of the layout designing method according to the present invention.
Figure 26:
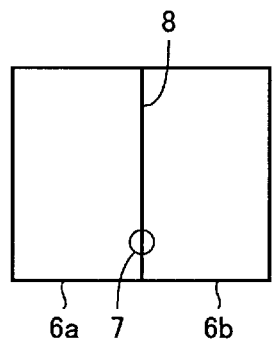
FIG. 26 is a schematic view illustrating the fourth embodiment of the layout designing method according to the present invention shown in FIG. 25.
Figure 27:
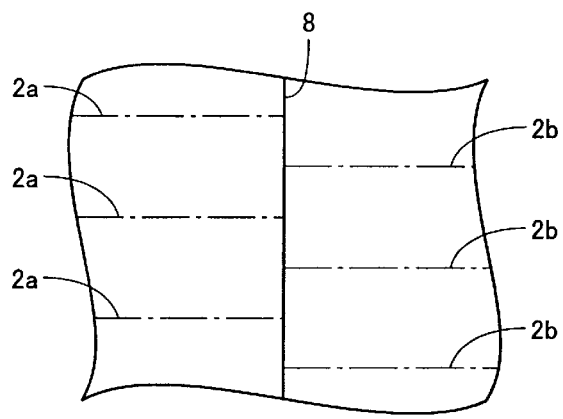
FIG. 27 is an enlarged schematic view of a border region in FIG. 26.

Referring to FIGS. 25 to 27, the fourth embodiment of the layout designing method according to the present invention will be described.

First, as shown in FIG. 25, the step of entering circuit patterns (S10) is executed as in the first to third embodiments of the present invention. Here, a case is considered in which there are at least two automatic arrangement/interconnection regions 6a, 6b with a borderline 8 interposed in between, that are partial regions performing automatic arrangement of interconnections or the like, as shown in FIG. 26. In this case, in the step of entering circuit patterns (S10), for example, the coordinate data of the circuit patterns formed within the automatic arrangement/interconnection regions 6a, 6b is entered for each of the regions.

Next, the step of extracting an arrangement/interconnection region (S60) extracting, from the entered circuit patterns, any one of automatic arrangement/interconnection regions 6a and 6b in which dummy patterns are not yet determined.

Subsequently, the step of recognizing pattern pitches (S20), the step of producing dummy patterns (S30) and the step of extracting dummy patterns (S40) are executed for the one of the regions (for example, automatic arrangement/interconnection region 6a) extracted in the step of extracting an automatic arrangement/interconnection region (S60), as in the first embodiment of the present invention. As a result, dummy patterns can be obtained for automatic arrangement/interconnection region 6a.

Thereafter, the step of determining if dummy patterns are extracted for all the automatic arrangement/interconnection regions (S70) is executed. Here, if the dummy patterns have not yet been extracted for the other automatic arrangement/interconnection region (for example, automatic arrangement/interconnection region 6b), the steps from the step of extracting an automatic arrangement/interconnection region (S60) to the step of extracting dummy patterns are again executed.

As a result, optimal dummy patterns can be extracted independently for a plurality of automatic arrangement/interconnection regions 6a, 6b. Further, in the step of determining if dummy patterns were extracted for all the automatic arrangement/interconnection regions 6a and 6b (S70), if it is determined that the dummy patterns were extracted for all the automatic arrangement/interconnection regions, the step of outputting a layout pattern constituted by circuit patterns and the extracted dummy patterns (S50) is executed.

Thus, dummy patterns can be extracted independently for each of regions 6a and 6b.

Therefore, in automatic arrangement/interconnection regions 6a and 6b, when the pitches of the respective circuit patterns are different and thus pitch additional lines 2a, 2b are displaced from each other, the pattern density can be improved compared to the case where either one of the pitches of automatic arrangement/interconnection regions 6a, 6b is used to produce dummy patterns for both automatic arrangement/interconnection regions 6a and 6b.

Fifth Embodiment

Figure 28:
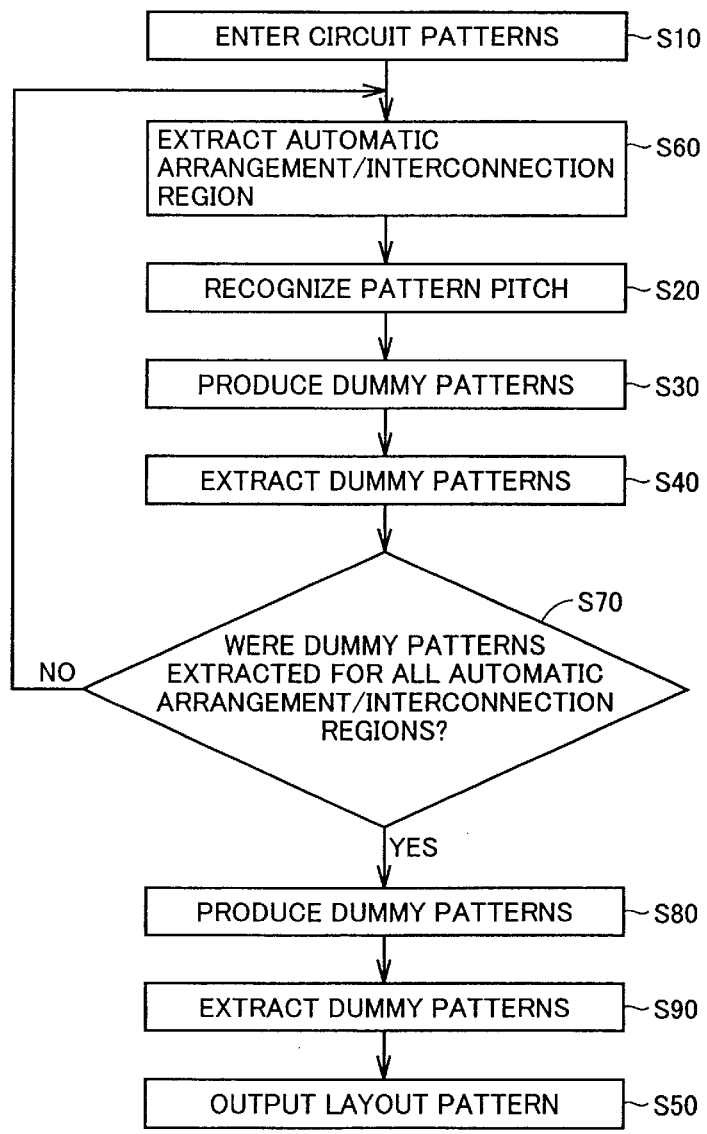
FIG. 28 is a flow chart illustrating the fifth embodiment of the layout designing method according to the present invention.
Figure 29:
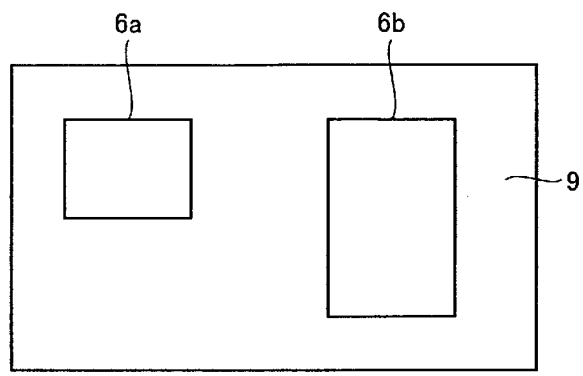
FIG. 29 is a schematic view illustrating the steps in the fifth embodiment of the layout designing method according to the present invention shown in FIG. 28.
Figure 30:
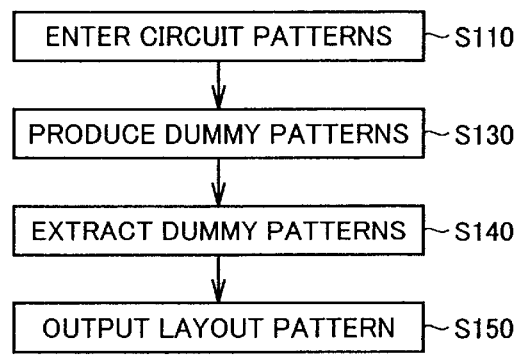
FIG. 30 is a flow chart illustrating a conventional layout designing method.
Figure 31:
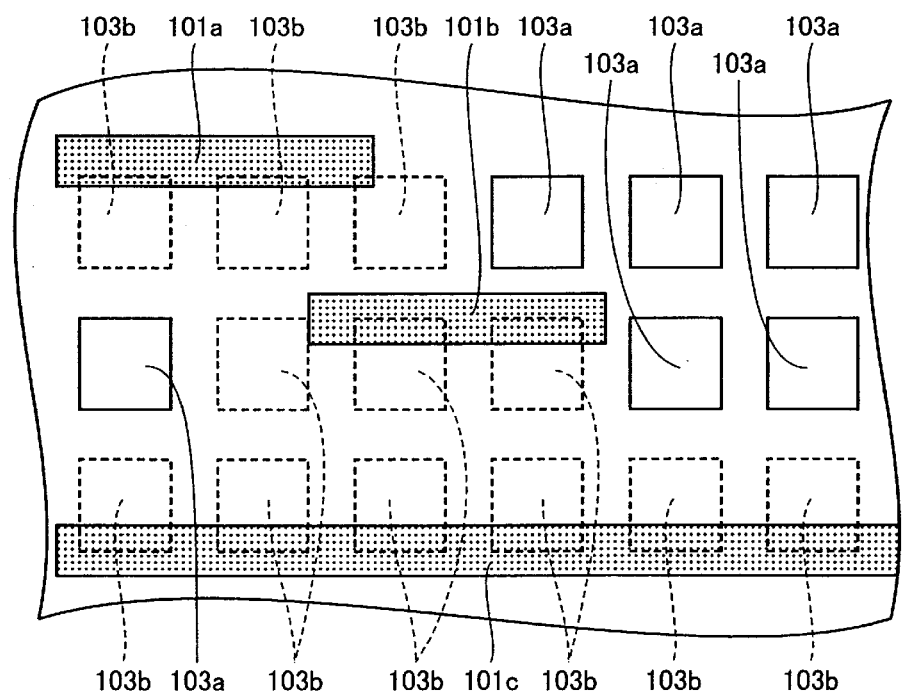
FIG. 31 is a schematic view showing a layout pattern obtained by the layout designing method shown in FIG. 30.

Referring to FIGS. 28 and 29, the fifth embodiment of the layout designing method according to the present invention will be described.

In the region where a pattern layout is designed, when a portion is designed by the automatic arrangement/interconnection method, a portion of a circuit arrangement region 9 (a chip region) of which the layout is designed will be automatic arrangement/interconnection regions 6a and 6b, as shown in FIG. 29. In such a case, the fifth embodiment of the method of designing the layout pattern according to the present invention as described below will help to make the pattern density uniform simply and rapidly for the entire surface of circuit arrangement region 9.

Referring to FIG. 28, first, the step of entering circuit patterns (S10) entering circuit patterns for the entire circuit arrangement region 9 shown in FIG. 29. Next, the step of extracting an automatic arrangement/interconnection region (S60) is executed as in the case with the fourth embodiment of the present invention. As a result, either one of automatic arrangement/interconnection regions 6a and 6b (hereinafter referred to as regions 6a and 6b), in which no dummy pattern is produced, is recognized.

Subsequently, the step of recognizing pattern pitches (S20), the step of producing dummy patterns (S30) and the step of extracting dummy patterns (S40) are executed as in the fourth embodiment of the present invention, for either one of the recognized regions 6a and 6b. As a result, dummy patterns can be obtained for one region, for example, region 6a.

Subsequently, the step of determining if dummy patterns were extracted for all the automatic arrangement/interconnection regions (S70) is executed. If the dummy patterns were not obtained for all the automatic arrangement/interconnection regions 6a, 6b, the steps from the step of extracting an automatic arrangement/interconnection region (S60) to the step of extracting dummy patterns (S40) are executed again. These steps are executed for all the automatic arrangement/interconnection regions 6a, 6b.

Thereafter, in the step of determining if dummy patterns were extracted for all the automatic arrangement/interconnection regions (570), if it is determined that the dummy patterns were obtained for all the regions 6a and 6b, then the step of producing dummy patterns for the entire circuit arrangement region 9 will be executed. At this moment, the dummy patterns arranged for the entire circuit arrangement region 9 have a predetermined size, and are arranged in a matrix with a predetermined pitch.

Next, the step of extracting dummy patterns (S90) extracting dummy patterns located in regions not overlapping with regions 6a and 6b is executed.

Thereafter, the step of outputting a layout pattern (S50) is executed for the entire circuit arrangement region 9 having dummy patterns extracted in each of regions 6a and 6b, dummy patterns arranged in regions other than regions 6a, 6b in circuit arrangement region 9, and circuit patterns arranged within regions 6a, 6b or the like.

In this case, a similar effect to that of the first embodiment of the present invention can be attained. Moreover, the arrangement of dummy patterns can be optimized in regions 6a, 6b, i.e. partial regions in circuit arrangement region 9 forming a layout pattern. Furthermore, the pattern density can be made uniform for the entire circuit arrangement region 9 by arranging dummy patterns as peripheral dummy patterns also in the regions other than regions 6a, 6b in circuit arrangement region 9.

Further, the repetitive distance (pitch), the size and so forth are predetermined for dummy patterns (peripheral dummy patterns) formed in the regions other than regions 6a, 6b in circuit arrangement region 9, so that the arrangement process of the peripheral dummy patterns can be simplified. Therefore, the time needed for the layout designing method according to the present invention can be shortened.

It is noted that the layout designing method according to the present invention described above can be executed by the layout designing apparatus shown in FIG. 10.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A layout designing apparatus, comprising:
    an entry means for entering a plurality of circuit patterns of a semiconductor device;
    a recognition means for recognizing positional data of said entered plurality of circuit patterns;
    a dummy pattern arrangement means for producing a dummy pattern group including a plurality of dummy patterns, each of said plurality of dummy patterns being arranged per repetitive distance determined based on said recognized positional data of the circuit patterns;
    an extraction means for extracting a final dummy pattern including a dummy pattern located in a region other than a region overlapping with said circuit patterns, from said dummy pattern group; and
    an output means for outputting a layout pattern including said extracted final dummy pattern and said circuit patterns.

2. The layout designing apparatus according to claim 1, wherein
    said recognition means includes a pitch recognition means for recognizing a pitch in one direction of said circuit patterns, and
    said dummy pattern arrangement means includes a means for determining a submultiple distance of said recognized pitch as said repetitive distance.

3. The layout designing apparatus according to claim 1, wherein
    said dummy pattern group includes a plurality of additional dummy patterns located between said plurality of dummy patterns, and
    said final dummy pattern includes said additional dummy patterns located in a region other than a region overlapping with said circuit patterns.

4. The layout designing apparatus according to claim 1, wherein each of said plurality of dummy patterns is arranged per said repetitive distance using positions of said circuit patterns as a reference.

5. The layout designing apparatus according to claim 1, wherein said dummy pattern arrangement means arranges said dummy patterns in a partial region including said circuit patterns, of a region forming a layout pattern, and said output means outputs a layout pattern including a partial layout pattern for said partial region.

6. The layout designing apparatus according to claim 5, wherein said output means outputs a layout pattern including a peripheral dummy pattern located in a region other than a region occupied by said partial layout pattern, of said region forming the layout pattern.

7. The layout designing apparatus according to claim 6, wherein said peripheral dummy pattern is arranged based on a repetitive distance determined independently of a distance between said plurality of circuit patterns.

8. A layout designing method, comprising the steps of:

entering a plurality of circuit patterns of a semiconductor device;

recognizing positional data of said entered plurality of circuit patterns;

producing a dummy pattern group including a plurality of dummy patterns, each of said plurality of dummy patterns being arranged per repetitive distance determined based on said recognized positional data of the circuit patterns;

extracting a final dummy pattern including a dummy pattern located in a region other than a region overlapping with said circuit patterns, from said dummy pattern group; and outputting a layout pattern including said extracted final dummy pattern and said circuit patterns.

9. The layout designing method according to claim 8, wherein said step of recognizing includes a step of recognizing a pitch in one direction of said circuit patterns; and said step of producing the dummy pattern group includes a step of determining a submultiple distance of said recognized pitch as said repetitive distance.

10. The layout designing method according to claim 8, wherein said dummy pattern group includes a plurality of additional dummy patterns located between said plurality of dummy patterns, and said final dummy pattern includes said additional dummy patterns located in a region other than a region overlapping with said circuit patterns.

11. The layout designing method according to claim 8, wherein each of said plurality of dummy patterns is arranged per said repetitive distance using positions of said circuit patterns as a reference.

12. The layout designing method according to claim 8, wherein said step of producing the dummy pattern group includes arrangement of said dummy patterns in a partial region including said circuit patterns, of a region forming a layout pattern, and said step of outputting includes outputting of a layout pattern including a partial layout pattern for said partial region.

13. The layout designing method according to claim 12, wherein said step of outputting includes outputting of a layout pattern including a peripheral dummy pattern located in a region other than a region occupied by said partial layout pattern of said region forming the layout pattern.

14. The layout designing method according to claim 13, wherein said peripheral dummy pattern is arranged based on a repetitive distance determined independently of a distance between said plurality of circuit patterns.

15. A semiconductor device manufactured using the layout designing method according to claim 8.

* * * * *